(12) United States Patent
Kohl

(10) Patent No.: US 9,223,226 B2
(45) Date of Patent: *Dec. 29, 2015

(54) MICROLITHOGRAPHIC PROJECTION EXPOSURE APPARATUS ILLUMINATION OPTICS

(75) Inventor: Alexander Kohl, Aalen (DE)

(73) Assignee: Carl Zeiss SMT GmbH, Oberkochen (DE)

( * ) Notice: Subject to any disclaimer, the term of this patent is extended or adjusted under 35 U.S.C. 154(b) by 1049 days.

This patent is subject to a terminal disclaimer.

(21) Appl. No.: 13/325,734

(22) Filed: Dec. 14, 2011

(65) Prior Publication Data

US 2012/0081686 A1     Apr. 5, 2012

Related U.S. Application Data

(62) Division of application No. 11/777,845, filed on Jul. 13, 2007, now Pat. No. 8,085,382.

(60) Provisional application No. 60/807,367, filed on Jul. 14, 2006, provisional application No. 60/888,647, filed on Feb. 7, 2007.

(30) Foreign Application Priority Data

Jul. 14, 2006   (DE) ................... 10 2006 032 810

(51) Int. Cl.
*G03B 27/54* (2006.01)
*G03F 7/20* (2006.01)

(52) U.S. Cl.
CPC ........ *G03F 7/70466* (2013.01); *G03F 7/70108* (2013.01); *G03F 7/70208* (2013.01); *G03F 7/70566* (2013.01)

(58) Field of Classification Search
CPC ........... G03F 7/70108; G03F 7/70208; G03F 7/70466; G03F 7/70566
USPC ............................................. 355/67, 53, 71
See application file for complete search history.

(56) References Cited

U.S. PATENT DOCUMENTS

| | | |
|---|---|---|
| 4,458,994 A | 7/1984 | Jain et al. |
| 4,851,882 A | 7/1989 | Takahashi et al. |
| 4,947,030 A | 8/1990 | Takahashi |
| 5,453,814 A | 9/1995 | Aiyer |
| 5,477,309 A | 12/1995 | Ota et al. |
| 6,285,442 B1 | 9/2001 | Sato |
| 6,383,940 B1 | 5/2002 | Yoshimura |
| 6,657,787 B1 | 12/2003 | Otaki |

(Continued)

FOREIGN PATENT DOCUMENTS

| | | |
|---|---|---|
| DE | 41 24 311 | 1/1993 |
| DE | 199 21 795 | 11/2000 |

(Continued)

OTHER PUBLICATIONS

German examination report for the corresponding German Application No. 10 2006 032 810.8, dated Feb. 23, 2007.

(Continued)

*Primary Examiner* — Peter B Kim
(74) *Attorney, Agent, or Firm* — Fish & Richardson P.C.

(57) ABSTRACT

Optics, such as, for example, microlithographic projection exposure apparatus illumination optics, as well as related systems, methods, components and devices are disclosed.

16 Claims, 13 Drawing Sheets

(56) References Cited

U.S. PATENT DOCUMENTS

| | | |
|---|---|---|
| 6,900,943 B2 | 5/2005 | Andersen et al. |
| 7,534,533 B2 | 5/2009 | Nakano et al. |
| 8,085,382 B2 | 12/2011 | Kohl |
| 2002/0153362 A1* | 10/2002 | Sandstrom et al. ...... 219/121.73 |
| 2003/0030781 A1 | 2/2003 | Bleeker et al. |
| 2003/0117601 A1 | 6/2003 | Kudo |
| 2004/0262500 A1 | 12/2004 | Mengel |
| 2005/0128458 A1 | 6/2005 | Blatchford |
| 2006/0055834 A1 | 3/2006 | Tanitsu et al. |
| 2006/0072095 A1* | 4/2006 | Kudo et al. ..................... 355/67 |
| 2006/0076327 A1 | 4/2006 | Kobayashi et al. |
| 2006/0109444 A1 | 5/2006 | Kim et al. |
| 2006/0119825 A1* | 6/2006 | Munnig Schmidt ............ 355/67 |
| 2007/0146676 A1 | 6/2007 | Tanitsu et al. |
| 2007/0146677 A1 | 6/2007 | Suzuki |
| 2008/0013065 A1 | 1/2008 | Kohl |
| 2009/0073411 A1 | 3/2009 | Tanitsu |
| 2012/0081685 A1 | 4/2012 | Kohl |

FOREIGN PATENT DOCUMENTS

| | | |
|---|---|---|
| EP | 0552725 | 7/1993 |
| EP | 0 747 772 | 12/1996 |
| EP | 1 582 894 | 10/2005 |
| EP | 1 681 710 | 7/2006 |
| EP | 2 040 283 | 3/2009 |
| JP | 09-288251 | 11/1997 |
| JP | 2000-021748 | 1/2000 |
| JP | 2000-021751 | 1/2000 |
| JP | 2000-031028 | 1/2000 |
| JP | 2003-100626 | 4/2003 |
| JP | 2004-501384 | 1/2004 |
| JP | 2005-093522 | 4/2005 |
| JP | 2005-167254 | 6/2005 |
| JP | 2005-236088 | 9/2005 |
| JP | 2007-287760 | 11/2007 |
| WO | WO 01/079935 | 10/2001 |
| WO | WO 01/98731 | 12/2001 |
| WO | WO 2005/026843 | 3/2005 |
| WO | WO 2005/027207 | 3/2005 |
| WO | WO 2005/069081 | 7/2005 |
| WO | WO 2005/116772 | 12/2005 |
| WO | WO 2006/040184 | 4/2006 |
| WO | WO 2007/119839 | 10/2007 |
| WO | WO 2008/007632 | 1/2008 |

OTHER PUBLICATIONS

English translation of European search report for corresponding EP Application No. 07013477, dated Mar. 2, 2010.
Machine translation of JP 2000-021748, dated Jan. 21, 2000.
English translation of Japanese office action corresponding to patent application No. JP 2007-184 344, dated Feb. 13, 2012.
Taiwanese office action with English translation with respect to TW Appl. No. 96 125 654, dated Jun. 24, 2013.
Japanese office action with English translation with respect to JP Appl. No. 2007-184 344, dated Aug. 31, 2012.

\* cited by examiner

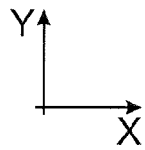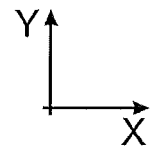
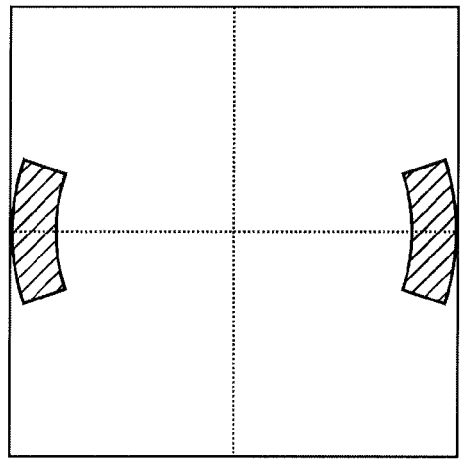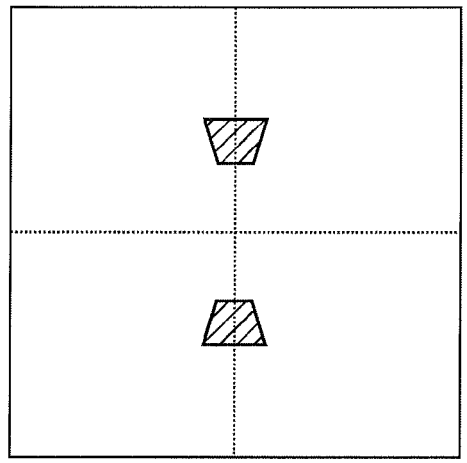
Fig. 18  Fig. 19
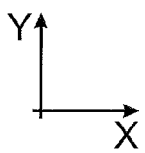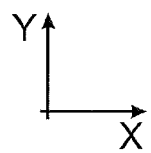
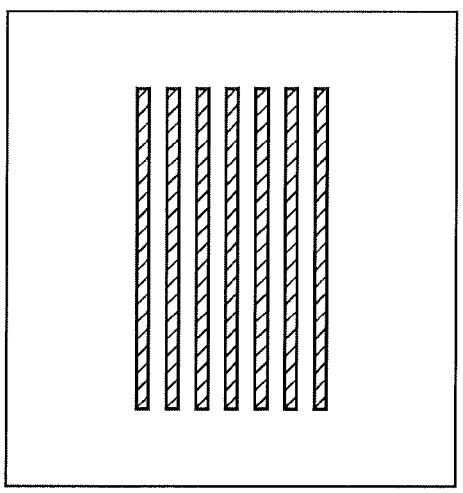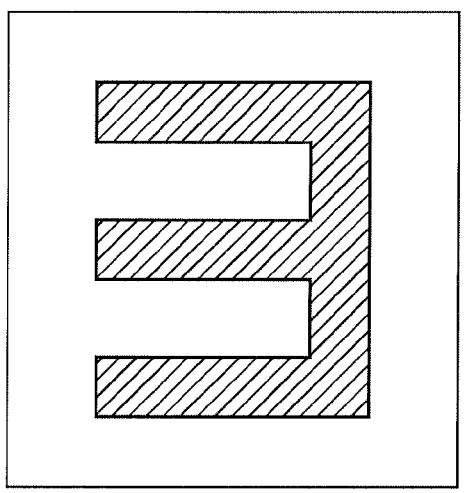
Fig. 20  Fig. 21

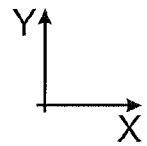
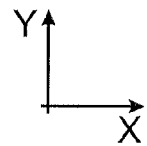
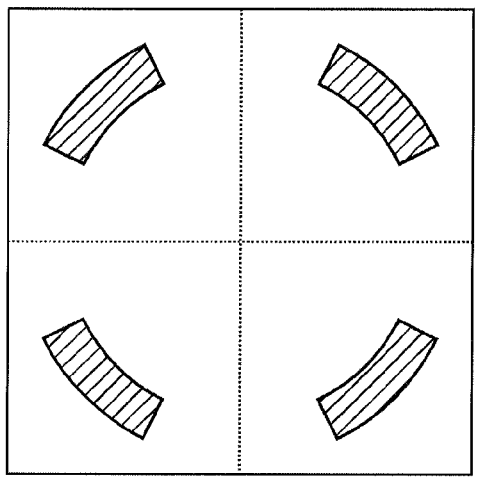
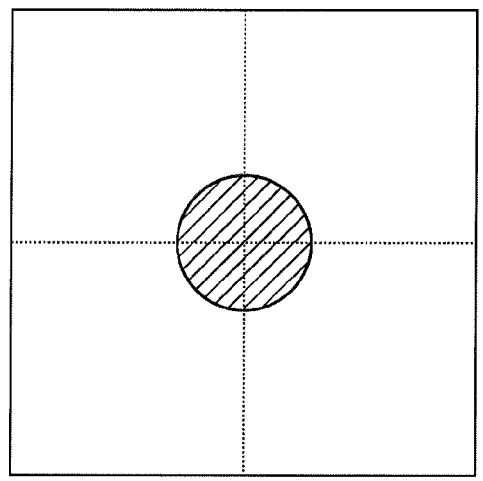
Fig. 22
Fig. 23
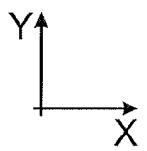
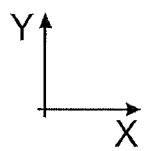
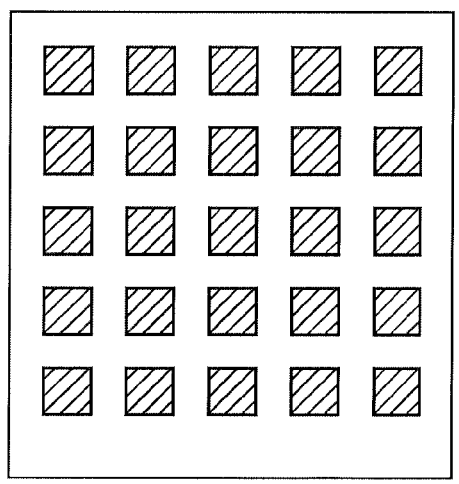
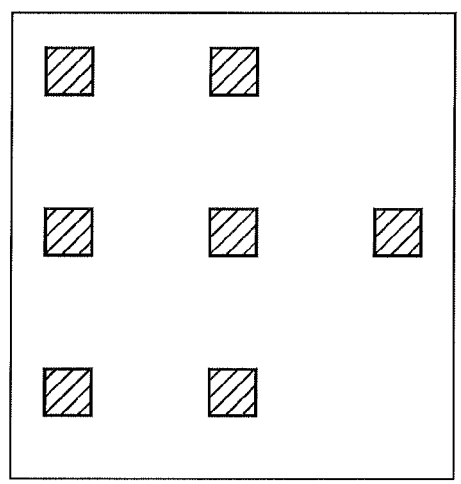
Fig. 24
Fig. 25

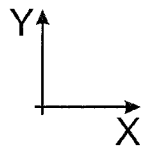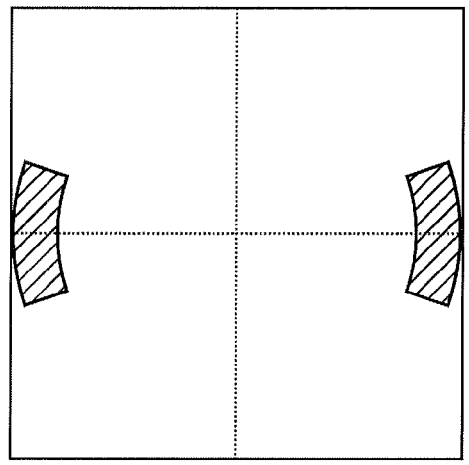
Fig. 26
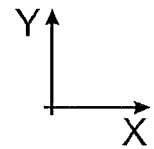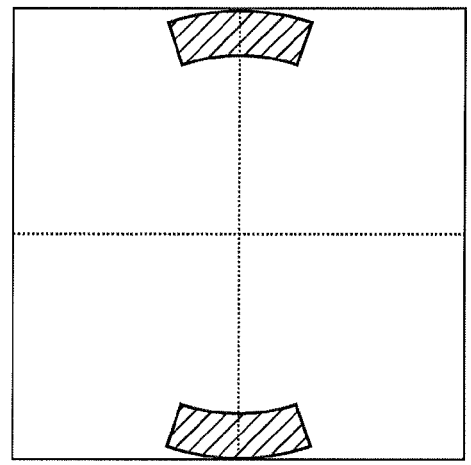
Fig. 27
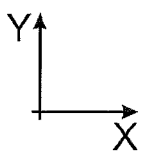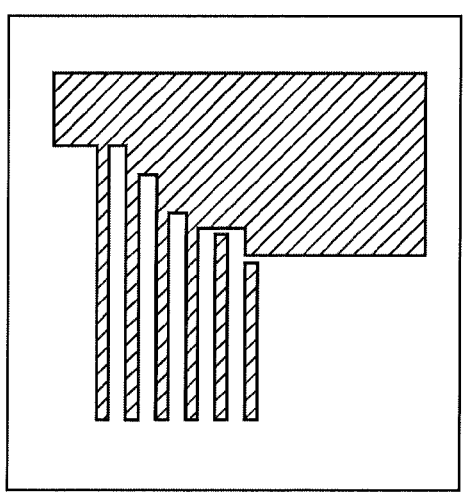
Fig. 28
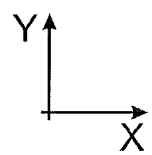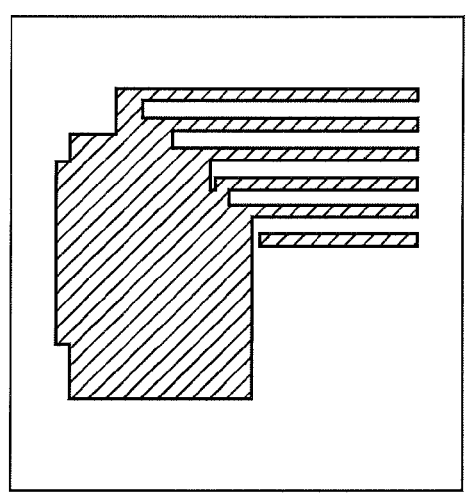
Fig. 29

MICROLITHOGRAPHIC PROJECTION EXPOSURE APPARATUS ILLUMINATION OPTICS

CROSS-REFERENCE TO RELATED APPLICATIONS

This application is a divisional of U.S. application Ser. No. 11/777,845, filed Jul. 13, 2007, now U.S. Pat. No. 8,085,382, which claims priority under 35 U.S.C. §119(e)(1) to U.S. provisional patent application Ser. No. 60/807,367, filed Jul. 14, 2006, and U.S. Provisional patent application Ser. No. 60/888,647, filed Feb. 7, 2007. U.S. application Ser. No. 11/777,845 also claims priority under 35 U.S.C. §119 to German patent application serial No. 10 2006 032 810.8, filed Jul. 14, 2006. The contents of these applications are hereby incorporated by reference in their entirety.

FIELD

The disclosure relates to optics, such as, for example, microlithographic projection exposure apparatus illumination optics, as well as related systems, methods, components and devices.

BACKGROUND

Typically, a microlithographic projection exposure apparatus includes an illumination system and a projection objective.

SUMMARY

The disclosure relates to optics, such as, for example, microlithographic projection exposure apparatus illumination optics, as well as related systems, methods, components and devices.

In one aspect, the disclosure features a microlithographic projection exposure apparatus illumination optical system. The illumination optical system has an optical path, an object plane and a pupil plane. The illumination optical system is configured so that, during use when light passes through the illumination optical system along the optical path, the illumination optical system illuminates a field of the object plane with the light. The illumination optical system includes an optical module that is configured so that during use the first optical module sets a first illumination setting in the pupil plane of the illumination optical system. The illumination optical system also includes an additional optical module that is configured so that during use the second optical module sets a second illumination setting in the pupil plane of the illumination optical system. In addition, the illumination optical system includes at least one decoupling element in the optical path upstream of the two optical modules. The decoupling element is configured so that during use the decoupling element provides light to at least one of the two optical modules. The illumination optical system further includes at least one coupling element in the optical path downstream from the two optical modules. The at least one coupling element is configured so that during use the at least one coupling element provides the light which has passed through at least one of the two optical modules to the illumination field.

In another aspect, the disclosure features a microlithographic projection exposure apparatus that includes a projection objective and the illumination optical system described in the preceding paragraph.

In a further aspect, the disclosure features a method that includes using the illumination system described in the preceding two paragraphs to make a microstructured component.

In an additional aspect, the disclosure features a system that includes a first optical module configured to be used in addition to a second optical module of illumination optics in a microlithographic projection exposure apparatus so that during use, when incorporated into the microlithographic projection exposure apparatus, the first and second optical module provide first and second illumination settings, respectively, in a pupil plane of the illumination optics. The system also includes at least one decoupling element configured to be incorporated into the illumination optics so that during use the at least one decoupling element is located in the optical path upstream from the first and second optical modules so that the at least one decoupling element provides light to at least one of the first and second optical modules. The system further includes at least one coupling element configured to be incorporated into the illumination optics so that during use the coupling element is located in the optical path downstream from the first and second optical modules so that it provides light from at least one of the first and second optical modules to the illumination field.

In one aspect, the disclosure features a microlithographic projection exposure apparatus that has a pupil plane. The microlithographic projection exposure apparatus includes a device configured so that, during use when light passes through the microlithographic projection exposure apparatus, the device alters an illumination setting in the pupil plane within a time period of 10 milliseconds or less.

In another aspect, the disclosure features a microlithographic projection exposure apparatus that has a pupil plane and that is configured to image an object into an image plane using multiple, nearly periodic pulses of light. The microlithographic projection exposure apparatus includes a device configured so that during use the device changes an illumination setting in the pupil plane from a first illumination setting to a second illumination setting.

In a further aspect, the disclosure features a system that includes a microlithographic projection exposure apparatus configured to image an object into an image plane using multiple, nearly periodic pulses of light. The microlithographic projection exposure apparatus includes a first optical element and a second optical element. The microlithographic projection exposure apparatus also includes a device configured so that during use the device alters the number of pulses between the first and second optical elements.

In an additional aspect, the disclosure features a microlithographic projection exposure apparatus configured to image an object into an image plane using multiple, nearly periodic pulses of light having an average pulse duration. The microlithographic projection exposure apparatus includes a first optical element and a second optical element. The microlithographic projection exposure apparatus also includes a device configured so that during use the device alters the average pulse duration between the first and second optical elements.

Embodiments can optionally provide one or more of the following advantages.

In some embodiments, the systems can allow for relatively fast changes in optical settings (e.g., illumination settings) during use. In some instances, fast changes of illumination settings can be desirable for multiple exposure in order to illuminate the mask briefly at two different illumination settings.

In certain embodiments, the systems can allow for relatively fast changes in optical settings (e.g., illumination settings) during use with relatively little or no movement of optical components and/or with relatively little or no light loss.

In some embodiments, such advantages can be provided, for example, by including in the system at least two optical modules that are adjusted (e.g., preadjusted) to produce specific illumination settings (e.g., polarization settings) such that it is possible to switch between the optical modules as appropriate. Optionally, switching between optical modules can be accomplished mechanically, such as, for example, by temporarily introducing a mirror into the illumination light path. Alternatively or additionally, switching between optical modules can be accomplished by modifying a characteristic of the illumination light. Under some circumstances, this can allow relatively substantially different illumination settings to be accessible with relatively little switching effort. Optionally, switching can be performed between more than two optical modules (e.g., by cascaded decoupling elements and coupling elements), which can, for example, allow for switching between more than two different illumination settings (e.g., more than two different polarization states).

In some embodiments, the change in light characteristic (e.g., polarization state) can take place in one second or less (e.g., one microsecond or less, 100 ns or less, 10 ns or less).

In some embodiments, use of polarization-selective beam splitter can result in an illumination light beam with a relatively large cross-section which can advantageously result in a relatively low-energy and/or relatively low-intensity load on the beam splitter. In certain embodiments, depending on the illumination light wavelength used, a polarization cube or a beam splitter cube used in a variation can be made of $CaF_2$ or of quartz. Optionally, use can also be made of a, for example, optically coated beam splitter plate which lets through light having a first polarization direction and reflects light having a second polarization direction.

Use of a Pockels cell can provide good switching between polarization states. Optionally, a Kerr cell which is suitable for changing the beam geometry can also be used. Also optionally, an acousto-optic modulator can be used as the light-characteristic changer in order to change the beam direction (the beam direction being modified by Bragg reflection).

In some embodiments, a light-characteristic changer can be particularly well suited for obtaining a light load which is distributed over the optical components and well adapted to the time characteristic of light emission of commonly used light sources.

In certain embodiments, a polarization changer can be an example of a light-characteristic changer where the light characteristic is changed by mechanically switching an optical component. The optical component can be switched so that, before and after switchover, the illumination light passes through the same optically active surface of the optical component. This is the case, for example, when a single $\lambda/2$ plate is used as a polarization changer. With other embodiments of the light-characteristic changer, various optically active regions of the optical component are used by this mechanical switching. The control expense for such a light-characteristic changer can be relatively low.

In some embodiments, use of a second polarization optical component can create the possibility of using a polarization optical beam splitter to extract the illumination light. The first polarization optical component of the polarization changer can be a $\lambda/2$ plate having, in its operating position, an optical axis which is oriented differently compared to the second polarization optical component. The first polarization optical component can be a free passage through the polarization changer.

In certain embodiments, changeover between the two optical modules can be obtained by temporarily inserting a mirror into the ray path of the illumination light. This variation requires relatively inexpensive control.

Examples of decoupling elements are known, for example, from metrology and optical scanner technology.

In some embodiments, a decoupling element can be relatively light weight.

In certain embodiments, the first illumination setting and the second illumination setting generally differ. However, in some embodiments, the second illumination setting may also be exactly the same as, or similar within predetermined tolerance limits to, the first illumination setting, so the first illumination setting does not significantly differ from the second illumination setting in any light characteristic. In such cases, the change between the illumination settings can still lead to a reduction in the optical load on the components of the first and the second optical module, as merely a respective portion of the overall illumination light acts on these optical modules. Illumination settings are also different if they differ exclusively in the polarization of the illumination light fed to the object or illumination field. Such a difference in polarization may be a difference in the type of polarization of the light passing through a local point in a pupil of the illumination optics. The pupil is in this case the region through which illumination light passes of a pupil plane which is, in turn, optically conjugate with a pupil plane of an objective, in particular a projection objective, downstream from the illumination optics. Alternatively or additionally, a difference in polarization may also be a difference in the spatial distribution of the orientation of the type of polarization relative to the pupil coordinate system beyond the various local points of the pupil. The term "type of polarization" or "polarization state" refers in the present document to linearly and/or circularly polarized light and to any form of combinations thereof such as, for example, elliptically, tangentially and/or radially polarized light. It is, for example, possible in a first illumination setting to irradiate the entire object field with a first illumination light linear polarization state which is constant over the pupil. A second illumination setting can use light having polarization rotated for this purpose through a constant angle, for example through 90°, with respect to an axis of rotation. The polarization distribution does not in this case vary on rotation about the axis of rotation through the aforementioned constant angle. Alternatively, it is possible in a first illumination setting to illuminate the pupil with a first spatial polarization distribution, for example with the same polarization over the entire pupil and in a second illumination setting to illuminate portions of the pupil with a first polarization direction of the illumination light and other portions of the pupil with a further polarization direction of the illumination light. In this case, not only the polarization direction but also the polarization distribution in the pupil is varied. Under the terms of the present application, illumination settings are different if their intensity distribution as a scalar variable and/or their polarization distribution as a vectorial variable differs over the pupil. The differing polarization states may be described as vectorial variables in the pupil based on vectorial E-field vectors of the illumination light. The pupil may in this case also have a non-planar (a curved surface). The intensity distribution is then described as a scalar variable and the polarization distribution is then described as a vectorial variable over this curved surface.

In some embodiments, the illumination settings may differ merely in terms of the polarization state, i.e. for example in the type of polarization (linear, circular) and/or in the polarization direction and/or in the spatial polarization distribution. This can allow the polarization state to be adapted to changing imaging features, especially features resulting from the geometry of the structures to be imaged.

In certain embodiments, an optical delay can allow defined time synchronization of the illumination light guided through the first optical module relative to the illumination light guided through the second optical module in the light path after the coupling element. This can be used to homogenize in time a dose of light onto the optical components from the coupling element in order thus to reduce, especially in the case of pulsed light sources, the deposition of energy per pulse in the optical components. This can apply especially to the optical components of the projection exposure apparatus arranged after the coupling element in the direction of the illumination or projection beam such as, for example, a condenser, a REMA (reticle/masking) objective, a reticle or a mask, optical components of a projection objective, immersion layers, the photoresist, the wafer and the wafer stage. The optical delay component may be an optical delay line arranged in the light path of the first optical module or in the light path of the second optical module. The optical delay can be adjustable via the optical delay component, and this can be achieved, for example, via a linear sliding table movable along a path over which the illumination light can be guided several times and a mirror, in particular a retroreflecting mirror, rigidly connected to the linear sliding table. Alternatively, and especially for setting relatively short delay paths, the optical delay component may be configured as an optically transparent and optically denser medium having a predetermined optical path. Use may also be made of a combination of an optical delay component wherein the optical delay is based on enlargement of the pure path and an optical delay component wherein the optical delay is based on a light path in an optically denser medium.

In some embodiments, the illumination optics can have a relatively small peak load on the reticle and/or on optical components downstream from the decoupling beam splitter.

In some embodiments, by changing the light characteristic during the illumination light pulse, this pulse can be split into two light pulse parts which are then shaped into different illumination settings. This can advantageously reduce the illumination light load on the components, in particular the local load on the components. By changing the light characteristic during the illumination light pulse, if a laser is chosen as the light pulse source, it is possible to work with half the laser repetition rate, twice the pulse energy and double the pulse duration. The single pulse energy is in this case the integral of the power of the individual pulse over the pulse duration thereof. In some instances, such lasers can be relatively easily integrated in a microlithographic projection exposure apparatus.

In certain embodiments, the optical modules can be subjected to a relatively low mean light output to which the optical modules are subjected because not all light pulses from the light source are conducted through the same optical module. Assuming appropriate synchronization, a decoupling element can be used instead of the light-characteristic changer. In such instances, the decoupling element can let through every second light pulse, for example, and the light pulses in between are reflected by the mirror elements of the decoupling element to the other optical module. The light-characteristic changer may, for example, be configured in such a way that the light characteristic changes between two successive light pulses.

In some embodiments, illumination light which is generated by the at least two light sources can be coupled into an illumination light beam by a coupling optical device and this light beam illuminates the illumination field. A beam splitter of the same type as the coupling or decoupling beam splitter can be used to obtain coupling; this is, however, not compulsory. Alternatively, it is possible, for example, to merge at least two illumination light beams from the light sources via coupling mirrors or coupling lenses.

In certain embodiments, the illumination system can be relatively compact.

In certain embodiments, a control system can allow proportional adjustment of illumination of the illumination field with various preset illumination settings. These components can be produced by time-proportional illumination, i.e. by sequential illumination initially with a first and then with at least one other illumination setting or by intensity-proportional illumination, i.e. parallel illumination of the illumination field with a plurality of illumination settings with a preset intensity distribution. The main control system can also be connected to the coupling element by signals for control purposes if this is necessary in order to obtain changeover between optical modules.

In some embodiments, the control system can acquire information concerning the relevant illumination setting via its signal links to the components of the illumination system, can specify specific preset lighting settings by acting on the adjustment of the optical modules and make additional adaptations, for example via the reticle masking system or scan speeds.

The systems can be used, for example, in methods to manufacture components.

In some embodiments, the optics can be in the form of a supplementary module for a microlithographic projection exposure apparatus. The supplementary module can, for example, be retrofitted to an existing illumination optics and an existing illumination system. This can, for example, allow the optics described herein to be used in pre-existing systems. This can, for example, reduce the cost and/or complexity associated with using the optics described herein.

In certain embodiments, the individual components of the supplementary module, can be designed and developed as already described above in relation to the illumination optics according to the disclosure and the illumination system according to the disclosure. The further illumination setting provided by the supplementary module may differ from the illumination setting of the first optical module. In some applications, the further illumination setting can, in this case too, correspond within predetermined tolerance limits in all light characteristics to the illumination setting of the first optical module.

A number of references are incorporated herein by reference. In the event of an inconsistency between the explicit disclosure of the present application and the disclosure in the references, the present application will control.

Embodiments of the disclosure are described below with reference to the accompanying drawings.

BRIEF DESCRIPTION OF THE DRAWINGS

FIGS. 18 and 19 are schematic representations of embodiments of illumination settings.

FIGS. 20 and 21 are schematic representations of embodiments of mask structures.

FIGS. 22 and 23 are schematic representations of embodiments of illumination settings.

FIGS. 24 and 25 are schematic representations of embodiments of mask structures.

FIGS. 26 and 27 are schematic representations of embodiments of illumination settings.

FIGS. 28 and 29 show the two masks which are successively to be imaged onto the same wafer to be illuminated by double exposure with the illumination settings in FIGS. 26 and 27, respectively.

DETAILED DESCRIPTION

Figure 1:
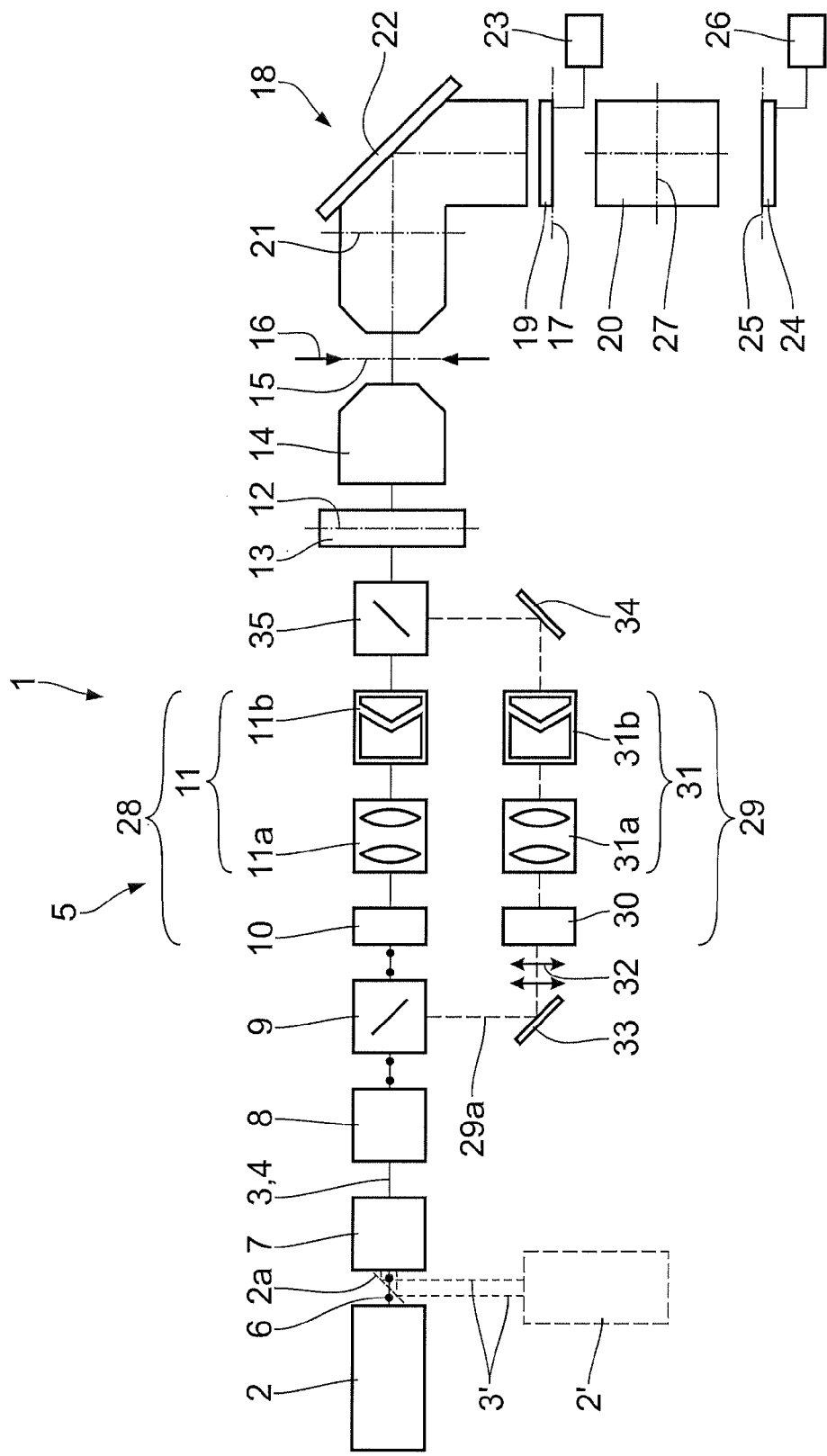
FIG. 1 is a schematic representation of an embodiment of a microlithographic projection exposure apparatus.

FIG. 1 shows a microlithographic projection exposure apparatus 1 which can be used, for example, in the fabrication of semiconductor components and other finely structured components and which uses light in the vacuum ultraviolet range (VUV) to achieve resolutions of fractions of a micrometer. A light source 2 is (e.g., an ArF excimer laser with a working wavelength of 193 nm) produces a linearly polarized light beam 3 which is coaxially aligned with an optical axis 4 of an illumination system 5 of the projection exposure apparatus 1. Other UV light sources (e.g., a $F_2$ laser with a working wavelength of 157 nm, an ArF laser with a working wavelength of 248 nm, a mercury vapour lamp with a working wavelength of 368 nm or 436 nm, light sources with wavelengths below 157 nm) can optionally be used as the light source 2.

Light exiting from the light source 2 is initially polarized perpendicularly to the plane of projection in FIG. 1 (s-polarization). This is indicated in FIG. 1 by the individual dots 6 on the light beam 3. This linearly polarized light from the light source 1 first enters a beam expander 7 which can be formed, for example, as a mirror arrangement (such as described, for example, in DE 41 24 311, which is hereby incorporated by reference) and is used to reduce the coherence and increase the cross-section of the beam. After the beam expander 7, the light beam 3 passes through a Pockels cell 8 which is an example of a light-characteristic changer. In general, as long as no voltage is applied to the Pockels cell 8, the light beam 3 is still s-polarized as it leaves the Pockels cell 8. The light beam 3 then passes through a decoupling beam splitter 9 which is an example of a decoupling element and is formed as a polarization cube made of $CaF_2$ or quartz. The decoupling beam splitter 9 lets the s-polarized light beam 3 through in the direction of the optical axis 4 and the beam passes through a first diffractive optical element (DOE) 10. The first DOE 10 is used as a beam-shaping element and is located in an entry plane of a first lens group 11 positioned in the ray path downstream therefrom.

The first lens group 11 includes a zoom system 11a and a subsequent axicon setup 11b. The zoom system 11a is doubly telecentric and designed as a scalar zoom so that optical imaging with preset magnification is achieved between one entry plane and one exit plane of the zoom system 11a. The zoom system 11a can also have a focal-length zoom function so that triple Fourier transformation, for example, is performed between the entry plane and the exit plane of the zoom system 11a. The illumination light distribution set after the zoom system 11a is subjected to radial redistribution by the axicon elements of the axicon setup which can be displaced axially towards each other provided that a finite distance is set between the opposite-facing conical axicon surfaces of the axicon elements. If this gap is reduced to zero, the axicon setup 11b basically acts as a plane-parallel plate and has practically no influence on the local distribution of illumination created by the zoom system 11a. The axial clearance between the optical components of the zoom system 11a and the axicon setup 11b can be adjusted by actuators.

The first lens group 11 is part of a pupil forming element which is used to set a defined local two-dimensional illumination intensity distribution for illumination light from the light source 2 in a pupil forming plane 12 of the illumination system 5 located downstream of lens group 11 (the illumination pupil or illumination setting).

The pupil forming plane 12 which is a pupil plane of the illumination system 5 coincides with the exit plane of the first lens group 11. A further optical raster element 13 is located in the immediate vicinity of the exit plane 12. A coupling optic 14 located downstream therefrom transfers the illumination light to an intermediate field plane 15 in which a reticle masking system (REMA) 16, which is used as an adjustable field stop, is located. The optical raster element 13 has a two-dimensional arrangement of diffractive or refractive optical elements and has several functions. On the one hand, incoming illumination light is shaped by the optical raster element 13 so that, after passing through subsequent coupling optic 14 in the region of the field plane 15, it illuminates a rectangular shaped illumination field. The optical raster element 13 with a rectangular radiation pattern is also referred to as a field defining element (FDE) and generates the main component of the etendue and adapts it to the desired field size and field shape in the field plane 15 which is conjugate with a mask plane 17. The optical raster element 13 can be designed as a prism array in which individual prisms arranged in a two-dimensional field introduce locally determined specific angles in order to illuminate the field plane 15 as required. The Fourier transformation performed by coupling optic 14 that each specific angle at the exit of the optical raster element 13 corresponds to a location in the field plane 15 whereas the location of the optical raster element 13 (its position in relation to the optical axis 4, determines the illumination angle in the field plane 15). The beams emerging from the individual optical elements of the optical raster element 13 are superimposed in the field plane 15. It is also possible to construct FDE 13 as a multistage honeycomb condenser with microcylinder lenses and diffusing screens. By constructing FDE 13 and its individual optical elements appropriately, it is possible to ensure that the rectangular field in the field plane 15 is substantially homogeneously illuminated. FDE 13 is thus also used as a field shaping and homogenising element for homogenising the field illumination so that a separate light-mixing element, for instance an integrator rod acting through multiple internal reflection or a honeycomb condenser, can be dispensed with. This can make the optical setup in this region especially axially compact.

A downstream imaging objective 18, which is also referred to as a REMA objective, images the intermediate field plane 15 with the REMA 16 onto a reticle or its surface 19 in the mask plane 17 on a scale which can be, for example, from 2:1 to 1:5 and, in the embodiment shown in FIG. 1, is approximately 1:1. Imaging takes place without an intermediate image so that there is precisely one pupil plane 21 between the intermediate field plane 15, which corresponds to an object plane of imaging objective 18 and an image plane of imaging objective 18 which coincides with the mask plane 17 and corresponds to the exit plane of the illumination system and, at the same time, an object plane of downstream projection objective 20. The latter is a Fourier transformed plane relative to the exit plane 17 of the illumination system 5. A deflection mirror 22, tilted at 45° with respect to the optical axis 4 and positioned between the pupil plane 21 and the mask plane 17, makes it possible to install a relatively large illumination system 5, which is several meters long, horizontally and, at the same time, keep the reticle 19 horizontal.

Those optical components which guide illumination light from the light source 2 and, from it, form the illumination light which is directed at the reticle 19 are part of the illumination system 5 of the projection exposure apparatus. Downstream from the illumination system 5 there is a device 23 for holding and manipulating the reticle 19 arranged so that a pattern on the reticle falls in object plane 17 of the projection objective 20 and, in this plane, can be moved with the aid of a scan drive for scan operation in a scan direction which is perpendicular to the optical axis 4.

The projection objective 20 is used as a reduction objective and forms an image of the reticle 19 on a reduced scale, for example on a 1:4 or 1:5 scale, on the wafer 24 which is coated with a photoresistive layer or photoresist layer, the light-sensitive surface of which lies in image plane 25 of the projection objective 20. Refractive, catadioptric or catoptric projection objectives are possible. Other reduction scales, for instance greater minification, up to 1:20 or 1:200 are possible.

The semiconductor wafer 24 which is to be exposed is secured by the device 26 configured to hold and/or manipulate it which includes a scanner drive in order to move the wafer 24, in synchronism with the reticle 19, perpendicularly to the optical axis 4. These movements can be parallel to each other or anti-parallel, depending on the design of the projection objective 20. The device 26, which is also referred to as a wafer stage, and the device 23, which is also referred to as a reticle stage, are component parts of a scanner which is controlled via a scan controller.

The pupil forming plane 12 is located on or close to a position which is optically conjugate with next downstream pupil plane 21 and with image-side pupil plane of the projection objective 20. This way, the spatial and local light distribution in the pupil plane 27 of the projection objective 20 can be determined by the spatial light distribution and local distribution in the pupil forming plane 12 of the illumination system 5. Between each of the pupil surfaces 12, 21 and 27, there are field surfaces in the optical ray path which are Fourier-transformed surfaces relative to the relevant pupil surfaces. This can allow for a defined local distribution of illumination intensity in the pupil forming plane 12 can result in a specific angular distribution of the illumination light in the region of the downstream field plane 15 which, in turn, can correspond to specific angular distribution of the illumination light which falls onto the reticle 19. Together with the first DOE 10, the first lens group 11 forms a first optical component 28 configured to set a first illumination setting in the illumination pupil 12.

In some embodiments, the illumination system 5 can allow for relatively fast modification of the illumination pupil 12 during an illumination process (e.g., for an individual reticle 19). This can make double exposure or other multiple exposure possible at short time intervals.

A second optical module 29, which is located in the decoupling path 29a of the decoupling beam splitter 9, can be used for fast modification of the illumination setting in the pupil forming plane 12. The second optical module 29 includes the second DOE 30 and a second lens group 31 which is, in turn, divided up into a zoom system 31a and the axicon setup 31b. The two optical modules 28, 29 are of similar construction. The optical effect and the layout of the individual optical components of the zoom system 31a, the axicon setup 31b and of second DOE 30 are, however, different from the first optical module 28 so that illumination light from the light source 2 which passes through the second optical module 29 is influenced so that a second illumination setting which differs from the first illumination setting created by the first optical module 28 is produced in the pupil forming plane 12.

Decoupling path 29a is indicated in FIG. 1 by the dashed line. In the decoupling path 29a, the illumination light is guided in the parallel polarization direction (p-polarization) relative to the plane of projection in FIG. 1 which is indicated in FIG. 1 by double arrows 32 which are perpendicular to the optical axis in the decoupling path 29a.

A deflection mirror 33 is positioned, in the same way as the deflection mirror 22, between the decoupling beam splitter 9 and the second DOE 30. Another deflection mirror 34 is positioned between the axicon setup 31b of the second lens group 31 and a coupling beam splitter 35 which is constructed as a polarization cube like the decoupling beam splitter 9. The coupling beam splitter 35 is an example of a coupling element. The coupling beam splitter 35 is located in the optical path between the axicon setup 11b of the first lens plane 11 and the optical raster element 13. The illumination light guided onto the decoupling path 29a is deflected by the coupling beam splitter 35 so that, downstream from the coupling beam splitter, it travels precisely along the optical axis 4.

High voltage, typically 5 to 10 kV, can be applied to the Pockels cell 8 in order to obtain a rapid change of illumination setting. When high voltage is applied to the Pockels cell 8, the polarization of the illumination light can be rotated (e.g., from s to p) within a few nanoseconds. The p-polarized illumination light is extracted in the decoupling path 29a because a polarizer in the decoupling beam splitter 9 acts as a reflector for p-polarization. In the decoupling path 29a, the illumination light is subjected to different setting adjustment to the s-polarized illumination light which is not extracted. After deflection by the deflection mirror 34 via the coupling beam splitter 35, the polarizer of which acts as a reflector for p-polarized light, p-polarized illumination light which has passed through the second optical module 29 is coupled again in the direction of the optical axis 4.

The light source 2 can generate, for example, laser pulses having a duration of 150 ns or 100 ns and a single pulse energy of, for example, 30 mJ or 15 mJ at a repetition rate of, for example, 6 kHz.

Figure 2:
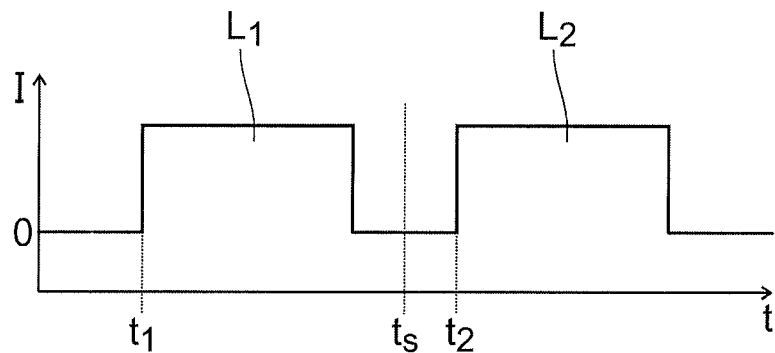
FIGS. 2 to 4 are schematic representations of two successive light pulses from a light source of a projection exposure apparatus.
Figure 3:
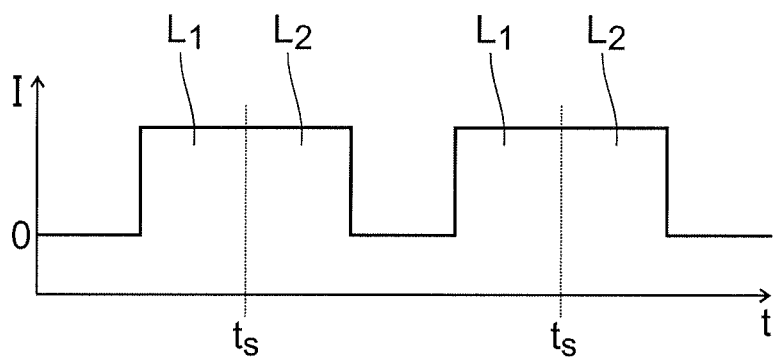
Figure 4:
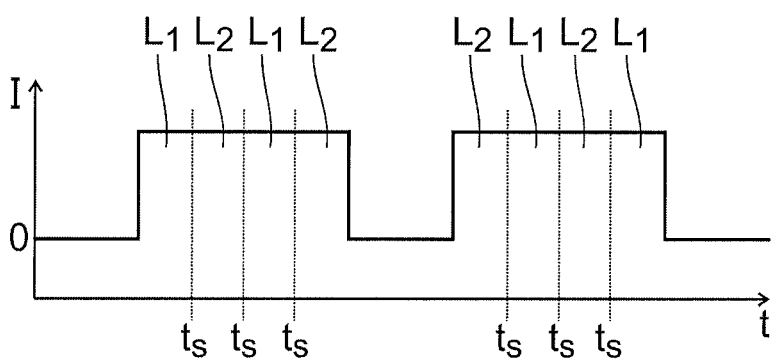

FIGS. 2 to 4 show various examples of switching times for high-voltage switching instants $t_s$ of the Pockels cell 8. FIGS.

2 to 4 all schematically show consecutive individual rectangular pulses L from the light source 2 at interval $t_z = t_2 - t_1$ which corresponds to the reciprocal of the 6 kHz repetition rate. In the switching-time example in FIG. 2, the Pockels cell 8 switches between every two laser pulses L. Laser pulse $L_1$ shown on the left in FIG. 2 passes through the Pockels cell without voltage being applied and therefore remains p-polarized. The polarization of subsequent laser pulse $L_2$ is rotated through 90° because switching instant $t_s$ has occurred and it therefore passes through the decoupling path 29a. The next laser pulse (not shown) passes through the Pockels cell 8 without its polarization being altered. In the case of the switching-time example in FIG. 2, every second laser pulse is therefore fed through the decoupling path 29a whereas the other laser pulses are not decoupled. The reticle 19 is therefore subjected to alternate illumination with two different illumination settings which correspond to the setting of the optical modules 28, 29 respectively and the laser pulses for each illumination setting have a repetition rate of 3 kHz. The radiation load incident on the reticle and the optical components of the illumination system downstream from the decoupling beam splitter 9 is determined by the energy and peak intensity of each individual laser pulse L.

In the switching-time example in FIG. 3, the Pockels cell 8 switches while a single laser pulse L is passing through it. Individual laser pulse L is therefore split into pulse parts $L_1$, $L_2$. In the example in FIG. 3, polarization of the leading laser pulse part $L_1$ is unaffected and it therefore remains s-polarized. In contrast, the polarization of the subsequent laser pulse part $L_2$ is subjected to rotation because it passes through the Pockels cell 8 after switching instant $t_s$, and is extracted and creates a different illumination setting to laser pulse part $L_1$. The two laser pulse parts $L_1$ and $L_2$ have a pulse duration equivalent to roughly half the pulse duration of the non-divided laser pulse which, in this embodiment, is therefore around 50 or 75 ns. The energy of the laser pulse parts is roughly half the energy of individual laser pulses (7.5 mJ or 15 mJ). The polarization of leading laser pulse part $L_2$ of the subsequent laser pulse in FIG. 3 is rotated and is therefore p-polarized. Voltage is removed from the Pockels cell 8 at switching instant $t_s$, so that the polarization of next laser pulse part $L_1$ is no longer affected and therefore remains s-polarized. This second laser pulse is therefore split. Switching repeats accordingly during laser pulses for subsequent laser pulses from the light source 2 which are not shown. In the switching-time example in FIG. 3, one laser pulse part is therefore fed through the decoupling path 29a, i.e. through the optical module 29, and the other laser pulse part is fed through the other optical module 28. In this switching-time example, the reticle 19 is illuminated at an effective repetition rate of 6 kHz with the first illumination setting and illuminated at the same effective repetition rate of 6 kHz with the second illumination setting. Because of the halving of the pulse energy in the laser pulse parts, the peak load on the reticle and the optical components downstream from the decoupling beam splitter 9 is reduced by a factor of roughly 2. In practice, this reduction factor can be even higher because the two different illumination settings generated by the optical modules 28, 29, in general, impinge on different regions of the pupil with different polarization characteristics.

In the switching-time example in FIG. 4, the Pockels cell 8 switches three times for each laser pulse L. In the case of leading laser pulse L shown on the left in FIG. 4, high voltage is initially applied to the Pockels cell but this voltage is then switched off and applied again. The left-hand laser pulse shown in FIG. 4 is therefore split into leading laser pulse part $L_1$ with s-polarization, subsequent laser pulse part $L_2$ with p-polarization, yet another subsequent laser pulse part $L_1$ with s-polarization and final laser pulse part $L_2$ with p-polarization. In the case of laser pulse L shown on the right in FIG. 4, these conditions are precisely reversed because when the Pockels cell 8 first switches during laser pulse L shown on the right in FIG. 4, the high voltage is initially switched off. The right-hand laser pulse L shown in FIG. 4 therefore has a leading p-polarized laser pulse part $L_2$, a subsequent s-polarized laser pulse part $L_1$, a subsequent p-polarized laser pulse part $L_2$ and a final s-polarized laser pulse part $L_1$. In the case of the switching-time example in FIG. 4, the illumination light impinges on the reticle 19 with an effective repetition rate of 12 kHz for both illumination settings. In the case of the switching-time example in FIG. 4, the light pulse parts $L_1$ and $L_2$ have a pulse duration of approximately 25 or 37.5 ns and a pulse energy of approximately 3.75 or 7.5 mJ. Because the individual light pulses are quartered by the triple switching of the Pockels cell 8 during one light pulse L, the peak load on the reticle 19 and on the optical components downstream from the decoupling beam splitter 9 drops by a factor of 4.

Depending on polarization state, the service life of optical materials depends not only on peak illumination power H, but also on the number of pulses N and the pulse duration T of the laser pulses. Various theoretical models in relation to this, which are familiar to persons skilled in the art, have been developed. One of these models is the polarization double refraction model according to which the load limit of optical materials depends on the product H×N. With the so-called compaction model or the microchannel model, the load limit depends on the product $H^2 \times N/T$.

Comparative analysis shows that it is possible to use a laser 2 with a halved repetition rate (number of pulses N/2), doubled pulse laser power (2H) and doubled pulse duration (2T) for double exposure by once-only changeover by the Pockels cell 8 during one laser pulse. Such lasers with a half repetition rate and doubled power are one possible way of increasing the performance of current lithographic lasers and can be implemented simply. Using the light-characteristic changer 8 makes it possible to use a 6 kHz laser in microlithographic applications which were previously only possible using a 12 kHz laser. The constructional requirements placed on the laser light source become commensurately less demanding.

A polarization-changing light-characteristic changer other than the Pockels cell 8 can be used to influence the polarization of the illumination light, for example a Kerr cell.

Instead of polarization, a different characteristic of the illumination light can be influenced by the light-characteristic changer, for example the light wavelength. In this case, dichroitic beam splitters can be used as the decoupling beam splitter 9 and as the coupling beam splitter 35.

The beam geometry of the light beam 3 or its direction can be the light characteristics that are modified by an appropriate light-characteristic changer in order to switch between the two optical modules 28, 29. A Kerr cell or an acousto-optic modulator can be used as an appropriate light-characteristic changer.

An embodiment with two optical modules 28, 29 is described above. It is equally possible to provide more than two optical modules and switch between them. For example, another Pockels cell which rotates the polarization of the illumination light at preset switching times, thereby causing extraction into another decoupling load which is not shown in FIG. 1, can be provided between the decoupling beam splitter 9 and DOE 10 or in the decoupling path 29a. This way, it is possible to obtain fast changeover between more than two illumination settings.

The Pockels cell 8 can also be located inside the light source 2 and chop the laser pulses generated in the light source 2 into several light pulse parts of the same kind as parts $L_1$ and $L_2$. This can result in little or no laser coherence and can, for example, reduce the possibility of undesirable interference in the mask plane 17.

Figure 5:
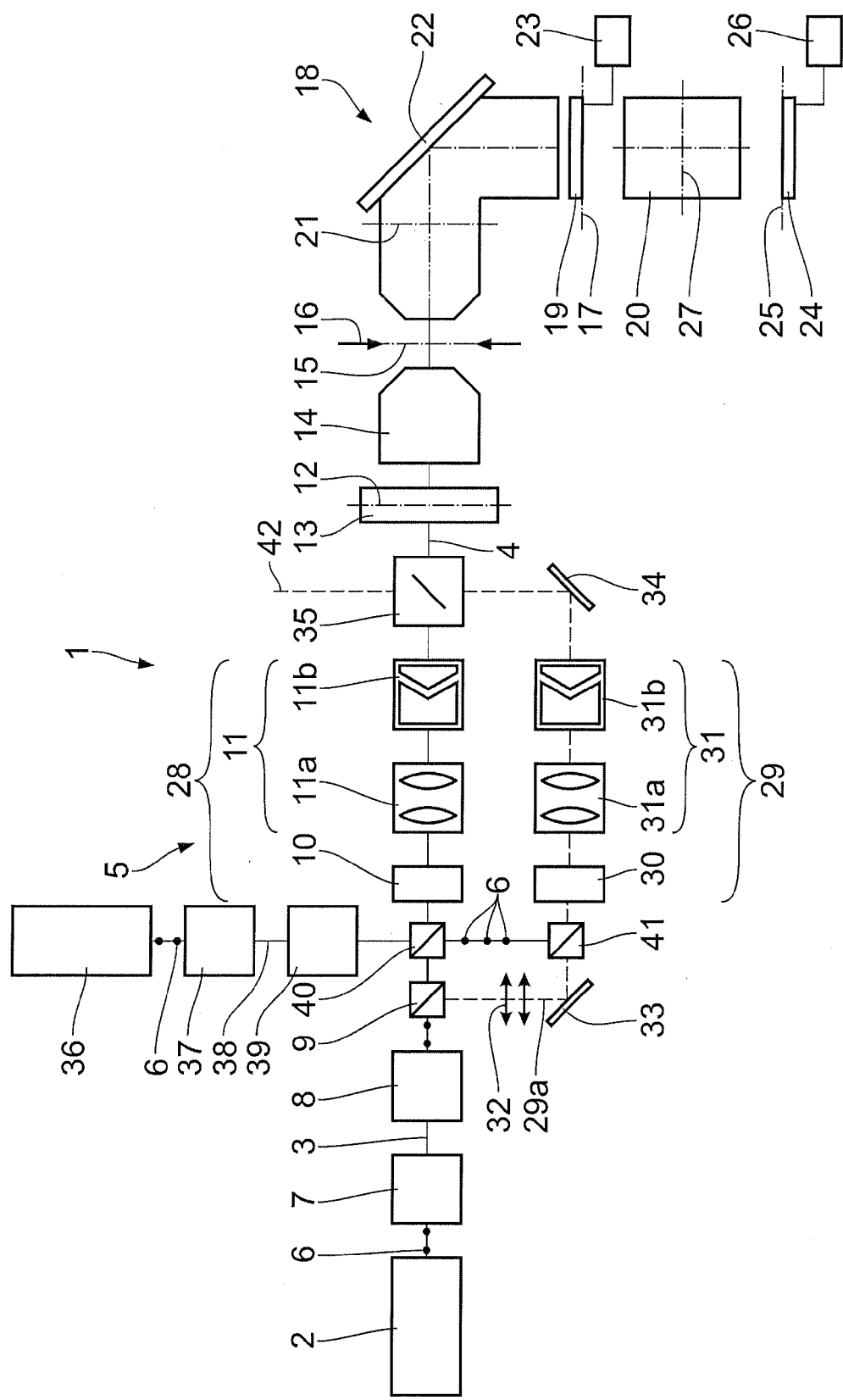
FIG. 5 is a schematic representation of an embodiment of a microlithographic projection exposure apparatus.

FIG. 5 shows an embodiment of an illumination system. Components that are identical to those already described above with reference to FIGS. 1 to 4 have the same reference numerals and are not individually described again. The illumination system in FIG. 5 can be implemented in combination with all the design variations that are described above with reference to the embodiment in FIGS. 1 to 4.

In addition to the light source 2, the illumination system 5 in FIG. 5 has another light source 36, the internal construction of which can be identical to that of the light source 2. Downstream from the light source 36, there is a beam expander 37, the construction of which can be identical to that of the beam expander 7. A light beam 38 from the light source 36 is expanded by the beam expander 37 (e.g., as already described in connection with the light beam 3 from the light source 2). Downstream from beam expander 37, there is a Pockels cell 39. After exiting the other light source 36, the light beam 38 is also initially s-polarized as indicated by dots 6 on the light beam 38. As long as no voltage is applied to the Pockels cell 39, the light beam 38 remains s-polarized after passing through the Pockels cell 39. After the Pockels cell 39, the light beam 38 impinges on a second decoupling beam splitter 40. The light beam splitter 40 lets s-polarized light through and reflects p-polarized light to the right by 90° in FIG. 5. A polarization-selective deflection element 41 is located downstream from the second decoupling beam splitter 40 in the beam splitter's forward direction. The deflection element is for s-polarized light which is incident from the direction of the second decoupling beam splitter 40, reflecting to the right by 90° in FIG. 5, and it lets p-polarized light through unimpeded.

Using the illumination system 5 in FIG. 5, light from the two light sources 2 and 36 can be injected optionally into the two optical modules 28, 29.

When no voltage is applied to the two Pockels cells 8 and 39, the light source 2 illuminates the first optical module 28 because s-polarized light beam 3 from the two decoupling beam splitters 9 and 40 is allowed through unimpeded. As long as no voltage is applied to the two Pockels cells 8 and 39, the second light source 36 illuminates the second optical module 29 because the second decoupling beam splitter 40 lets the s-polarized light of the light beam 38 through unimpeded and this s-polarized light is deflected into the second optical module 29 by the deflection element 41.

When voltage is applied to the first Pockels cell 8 but not to the second Pockels cell 39, the two light sources 2 and 36 illuminate the second optical module 29. The now p-polarized light from the first light source 2 is extracted from the decoupling beam splitter 9, as described above, into the decoupling path 29a and, after deflection by the deflection mirror 33, passes through the deflection element 41 unimpeded so that it can enter the second optical module 29. The optical path of the light beam 38 from the second light source 36 remains unchanged.

When voltage is not applied to the first Pockels cell 8, but is applied to the second Pockels cell 39, the two light sources 2 and 36 illuminate the first optical module 28. The s-polarized light from the first light source 2 can pass through the two decoupling beam splitters 9 and 40 unimpeded and enters the first optical module 28. The light of the light beam 38 from the second light source 36 rotated into p-polarization by the second Pockels cell is reflected through 90° by the second decoupling beam splitter 40 and enters the first optical module 28.

When light from the two light sources 2 and 36 collectively impinges on one of the optical modules 28, 29, the light from the two light sources 2 and 36 which collectively passes through the optical module 28 or 29 can have two different polarization states.

P-polarized light which has passed through the first optical module 28 is reflected by the coupling beam splitter 35 in FIG. 5 upwards along the optical path 42, from where it has to be brought back in the direction of the optical axis 4 by another appropriate coupling device. The same applies to s-polarized light which is fed through the second optical module 29 and which passes through the coupling beam splitter 35, without being deflected thereby, in the direction of the optical path 42.

Figure 6:
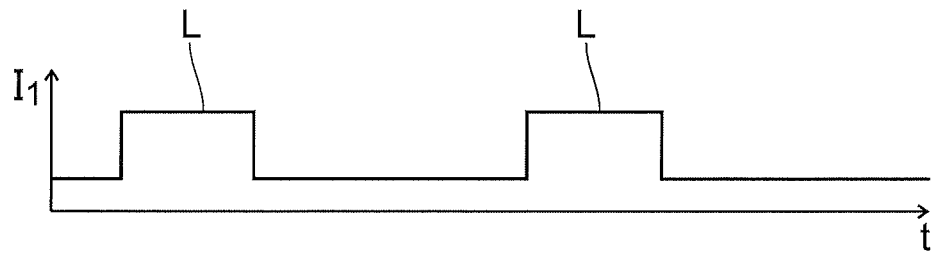
FIGS. 6 to 9 are schematic representations of two successive light pulses from a light source of a projection exposure apparatus.
Figure 7:
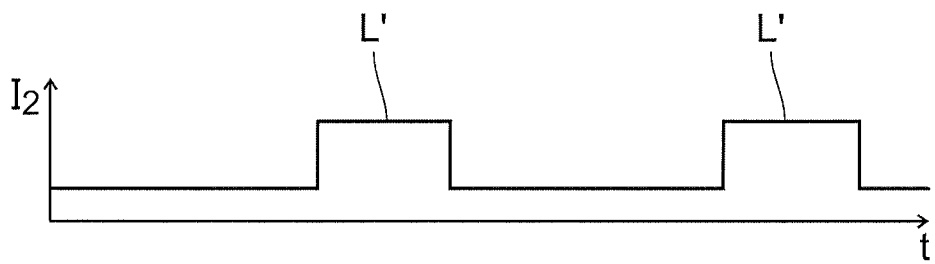

When voltage is applied to the two Pockels cells 8 and 39, light from the light source 2 is conducted through the second optical module 29 and light from the light source 36 is conducted through the first optical module 28. FIGS. 6 and 7 show the possible characteristics, as a function of time, of the intensities $I_1$ of the light pulses L from the first light source 2 and of the intensities $I_2$ of the light pulses L' from the second light source 36. The two light sources 2 and 36 are synchronized with each other so that light pulses L' are generated during the gaps between two light pulses L. Two light pulses L and L' therefore do not impinge simultaneously on the second decoupling beam splitter 40 and the deflection element 41. Also, beyond the coupling beam splitter 36, laser pulses L and L' do not simultaneously impinge on downstream optical components of the illumination system 5 or on the reticle 19 and the wafer 24. As described above with reference to FIGS. 2 to 4, laser pulses L and L' can be split into two or more laser pulse parts $L_{1,2}$ and $L'_{1,2}$ by one or more optical polarization components and appropriate switching times. This reduces the illumination light load on the optical components as already described above with reference to FIGS. 2 to 4.

Two pulsed light sources with pulse waveforms according to FIGS. 6 and 7 can also be combined upstream from a single Pockels cell of the illumination system. To achieve this, light 3, for example, from the second light source 2 upstream from beam expander 7 can be injected into the optical path of the light beam 3 with the aid of a perforated mirror 2a which is tilted 45° relative to the optical axis 4. The light source 2', the light beam 3' and the perforated mirror 2a are shown in a dashed line in FIG. 1. The light beam 3' is also s-polarized. The light beam 3' from the light source 2' ideally has a mode which carries practically no energy in the region of a central hole in the perforated mirror 2a. The light beam 3 from the light source 2 passes through the hole in the perforated mirror 2a. The beam expander 7 is then illuminated by merged light beams 3 and 3'. The Pockels cell 8 is then used as a common Pockels cell in order to influence the polarization state of the light beams 3 and 3'.

Figure 8:
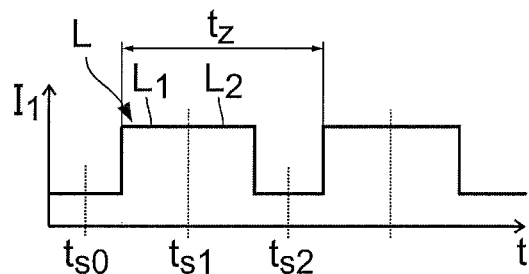
Figure 9:
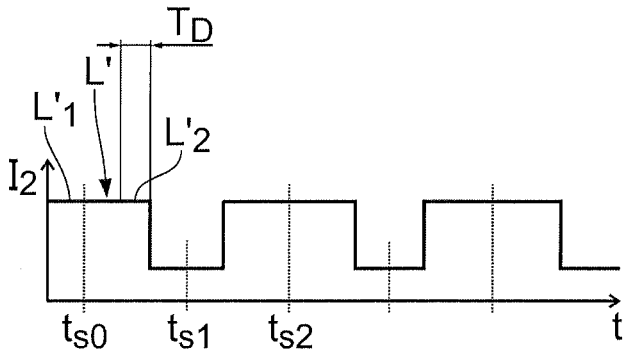

FIGS. 8 and 9 show another way of reducing the illumination light load on individual components of the illumination system 5 in FIG. 5 in situations where the light pulses L and L' of the two light sources 2 and 36 overlap in time. FIG. 8 shows the intensity $I_1$ of the light pulses L from the light source 2. FIG. 9 shows the intensity $I_2$ of the light pulses L' from the light source 36. The Pockels cell 8 is deenergized before the arrival of the first laser pulse L at $t=t_{s0}$. Laser pulse part $L_1$ therefore passes through the first optical module 28. The second Pockels cell 39 is also deenergized at $t=t_{s0}$ in synchronism with the first Pockels cell 8. Switching instant $t_{s0}$ coincides with the centre of a laser pulse L' of the second light source 36, so that subsequent light pulse part L'$_2$ is then conducted through the second optical module 29. In period T$_D$ between the rising edge of laser pulse L and the trailing edge of laser pulse L' following switching instant t$_{s0}$ during which the two laser pulses L and L' overlap, the two laser pulses L and L' are therefore separately conducted through the optical modules 28, 29 so that there is no simultaneous loading by the two laser pulses L and L'. At the next switching instant t$_{s1}$, voltage is applied to the two Pockels cells 8 and 30 in synchronism. Switching instant t$_{s1}$ coincides with the centre of laser pulse L of the light source 2. Subsequent laser pulse part L$_2$ therefore passes through the second optical module 29. In contrast, laser pulse part L'$_1$ of next laser pulse L' of the second light source 36 which overlaps with this laser pulse part L$_2$ is conducted through the first optical module 28.

At switching instant t$_{s2}$ in the centre of next laser pulse L', the process described with reference to switching instant t$_{s0}$ repeats. The frequency of switching instants t$_s$ is twice that of the laser pulses of individual light sources 2 and 36, with laser pulse L and L' of one light source being halved and with switching between two laser pulses L' and L of the other light source. This circuit ensures that light from the two light sources 2 and 36 is never conducted through a single optical module 28 or 29 and this reduces the load on the individual optical components of the optical modules 28, 29 accordingly.

Figure 10:
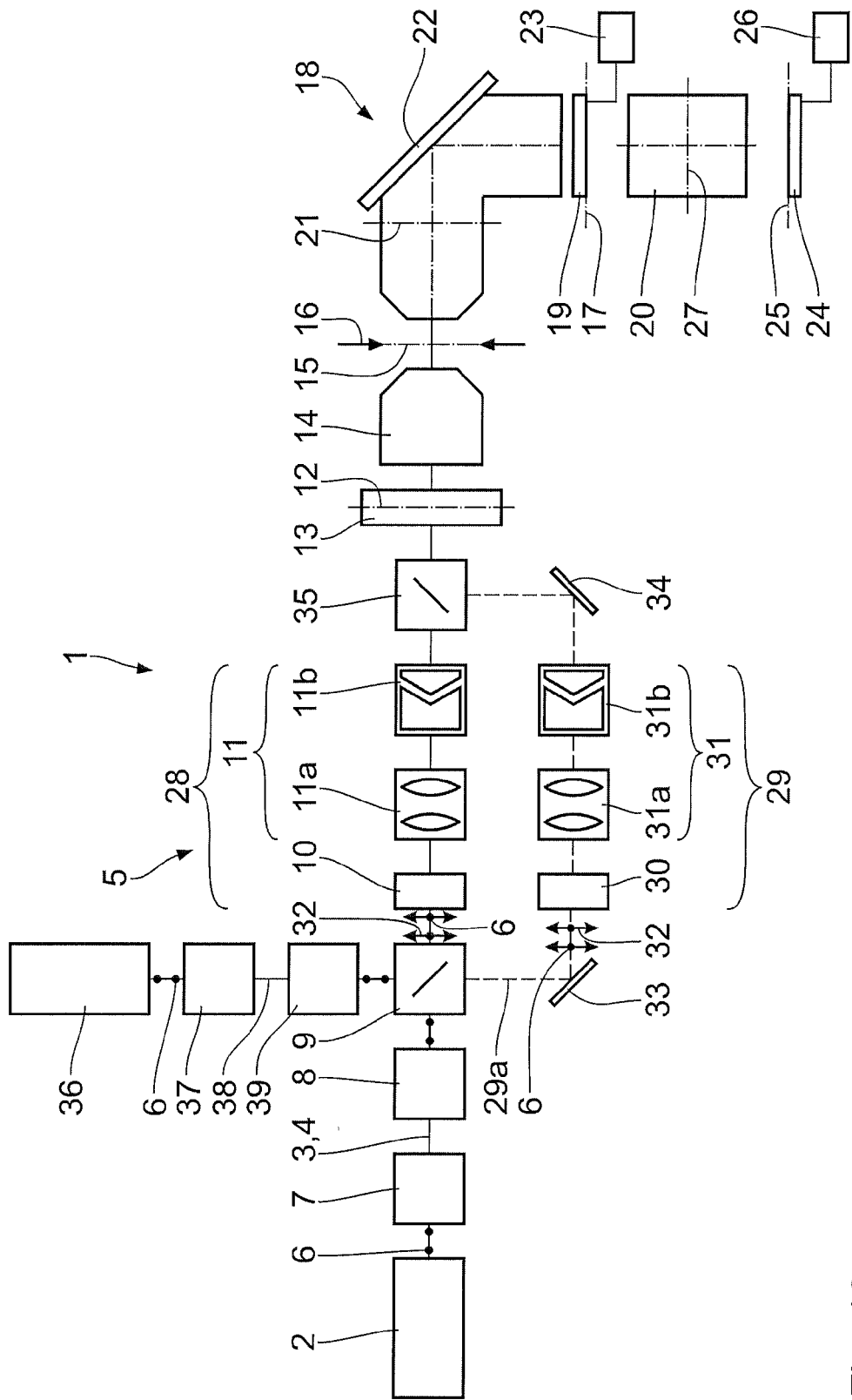
FIGS. 10 and 11 are schematic representations of embodiments of a microlithographic projection exposure apparatus

FIG. 10 shows an embodiment of the illumination system 5. Components that are identical to those already described above with reference to FIGS. 1 to 9 have the same reference numerals and are not individually described again. The variation in FIG. 10 is equivalent to the variation in FIG. 5, apart from the way in which the light from the second light source 36 is extracted. In FIG. 10, the decoupling beam splitter 9, which already extracts the light beam 3 of the light source 2, is used to extract the light beam 38 of the second light source 36.

The decoupling beam splitter 9 firstly lets the s-polarized light of the light source 2 and secondly lets the s-polarized light of the light source 36 through unimpeded, so that s-polarized light from the light source 2 impinges on the first optical module 28 and s-polarized light from the second light source 36 impinges on the second optical module 29. The decoupling beam splitter 9 reflects the p-polarized light of the light sources 2 and 36 through 90° respectively, so that p-polarized light from the second light source 36 impinges on the first optical module 28 and p-polarized light from the first light source 2 impinges on the second optical module 29.

In terms of coupling, the variation in FIG. 10 corresponds to that in FIG. 5.

In terms of the switching times of the Pockels cells 8 and 39, the examples of switching times described above with reference to FIGS. 6 to 9 can also be used in the system shown in FIG. 10.

In some embodiments, the change in light characteristic in order to change the optical path between the optical modules 28, 29 can take place in one second or less (e.g., one microsecond or less, 100 ns or less, 10 ns or less).

Switching of the Pockels cells 8 and 39 can be periodic at a fixed frequency. This frequency can be around 1 kHz, for example. Other exemplary frequencies are in the range from 1 Hz to 10 kHz.

By changing the light characteristic, it is believed that it is possible to ensure that the maximum laser power per laser pulse after creating an illumination setting in the pupil plane 12 is at least 25% lower than it would be using a conventional illumination system with the same setting measured at the same location.

The maximum intensity at a specific location in the illumination system can be, for example, up to 25% lower in the case of the designs according to the disclosure than in the case of conventional illumination systems with just one optical module.

Instead of the coupling beam splitter 35, an optical system which integrates the two optical paths can be provided in the form of, for example, a lens, an objective or a refractive mirror or a plurality of such mirrors. One example of such an optically integrating system is described in WO 2005/027207 A1.

Figure 11:
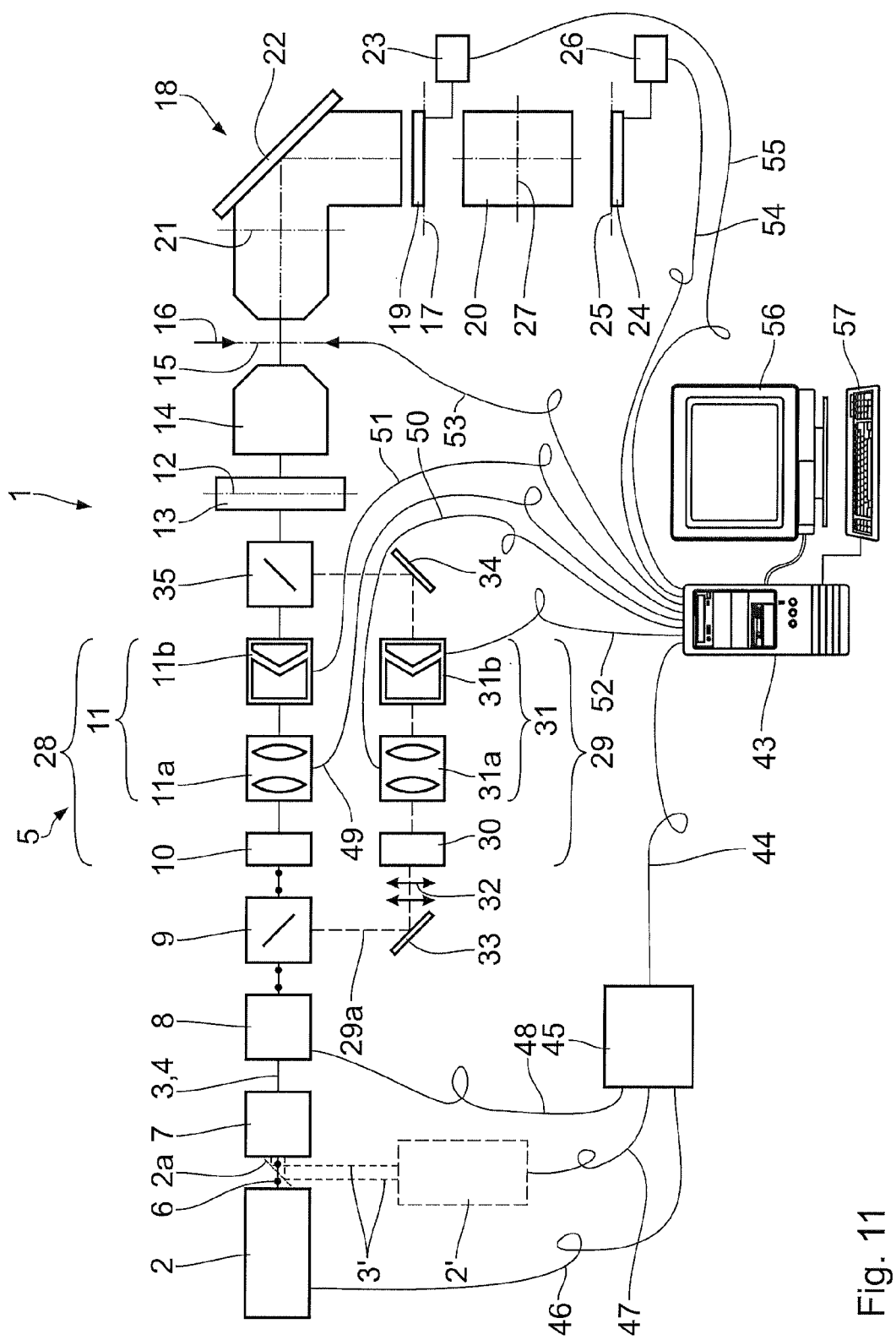

FIG. 11 shows an embodiment of a projection exposure apparatus 1 configured to produce proportional illumination of the illumination field via the first optical module 28, on the one hand, and via the second optical module 29, on the other hand, e.g. for specified double exposure of the reticle 19 using the two illumination settings that can be set via the optical modules 28, 29. Components of the projection exposure apparatus 1 in FIG. 11 that are identical to those already described above with reference to the projection exposure apparatus 1 in FIGS. 1 to 10 have the same reference numerals and are not individually described again.

The project exposure apparatus 1 in FIG. 11 has a main control system in the form of, for example, a computer 43 (e.g., to specify proportional illumination). The computer 43 is connected to a control module 45 by a signal cable 44. The control module 45 is connected by signals to the light source 2 by a signal cable 46, to a light source 2' by a signal cable 47 and to the Pockels cell 8 by a signal cable 48. The computer 43 is connected to the zoom systems 11a and 31a by the signal cables 49 and 50. The computer 43 is connected to the axicon setups 11b and 31b by signal cables 51 and 52. The computer 43 is connected to the REMA 16 by a signal cable 53. The computer 43 is connected to the wafer stage 26 by a signal cable 54 and to the reticle stage 23 by a signal cable 55. The computer 43 has a display 56 and a keyboard 57.

The computer 43 specifies the switching instants t$_s$ for the Pockels cell 8. By selecting the switching instants over time with the aid of the computer 43, it is possible to specify the intensity with which reticle 19 is illuminated using either of the two illumination settings that can be produced via the two optical modules 28, 29. The switching instants for the Pockels cell 8 can be synchronized with trigger pulses of the light sources 2 and 2' so that switching instants occur in correct phase relation during laser pulses as described above in connection with FIGS. 2 to 8.

Switching instants t$_S$ are specified depending on the particular illumination settings previously set in the optical modules 28, 29. The computer 43 receives information regarding the particular previously set illumination setting over the signal cables 49 to 52. The computer 43 can also actively set a predefined illumination setting by controlling appropriate displacement drives for the zoom systems 11a and 31a and for the axicon setups 11b and 31b over the corresponding signal cables.

Switching instants t$_s$ are also specified depending on the particular scanning process. The computer 43 receives information concerning this from the REMA 16 and stages 23 and 26 via the signal cables 53 to 55. Depending on the specified value, the computer 43 can also actively change the operating position of the REMA 16 and stages 23 and 26 by controlling appropriate drives via the signal cables 53 to 55. This way, the computer 43 can, depending on the particular operating situation of the projection exposure apparatus 1, make sure that each of the two optical modules 28, 29 contributes sufficient light to illuminate the illumination field on reticle 19. The computer 43 determines the relevant light contribution by integrating the intensity curves (cf. FIGS. 2 to 4 and FIGS. 7 to 9). Any excess light which is not needed for projection exposure can be coupled out of the exposure path by using a second Pockels cell and a downstream polarizer.

The main control system 43 can also be connected by signals to the decoupling element 9 and/or coupling element 35 if this is necessary in order to specify proportional illumination of the illumination field using the illumination settings that can be achieved via the optical modules 28, 29.

The main control system 43 makes time-proportional illumination of the illumination field on the reticle 19 possible via the first optical module 28 and the second optical module 29. Alternatively or additionally, the main control system 43 can also be used to obtain intensity-proportional illumination of the illumination field via the first optical module 28 and the second optical module 29. For instance, it is possible to illuminate the illumination field at 30% of total intensity via the first optical module 28 and at 70% of total intensity via the second optical module 29. This can be performed statically so that these percentages do not change over a predefined period. Alternatively, it is also possible to vary these proportions dynamically. To achieve this, the Pockels cell 8 can be driven, for example, by a sawtooth waveform having 1 ns timebase. To achieve this, the control circuit of the Pockels cell 8 can have a least one high-voltage generator. If fast switching between two voltages is desirable, the control circuit of the Pockels cell 8 can have two high-voltage generators. Besides high-voltage switching on a nanosecond timescale, there can also be additional high-voltage switching, for example on a millisecond timescale, so that, measured against the duration of the laser pulses, slow transitions between illumination settings that can be specified via the optical modules 28, 29 are possible.

Figure 12:
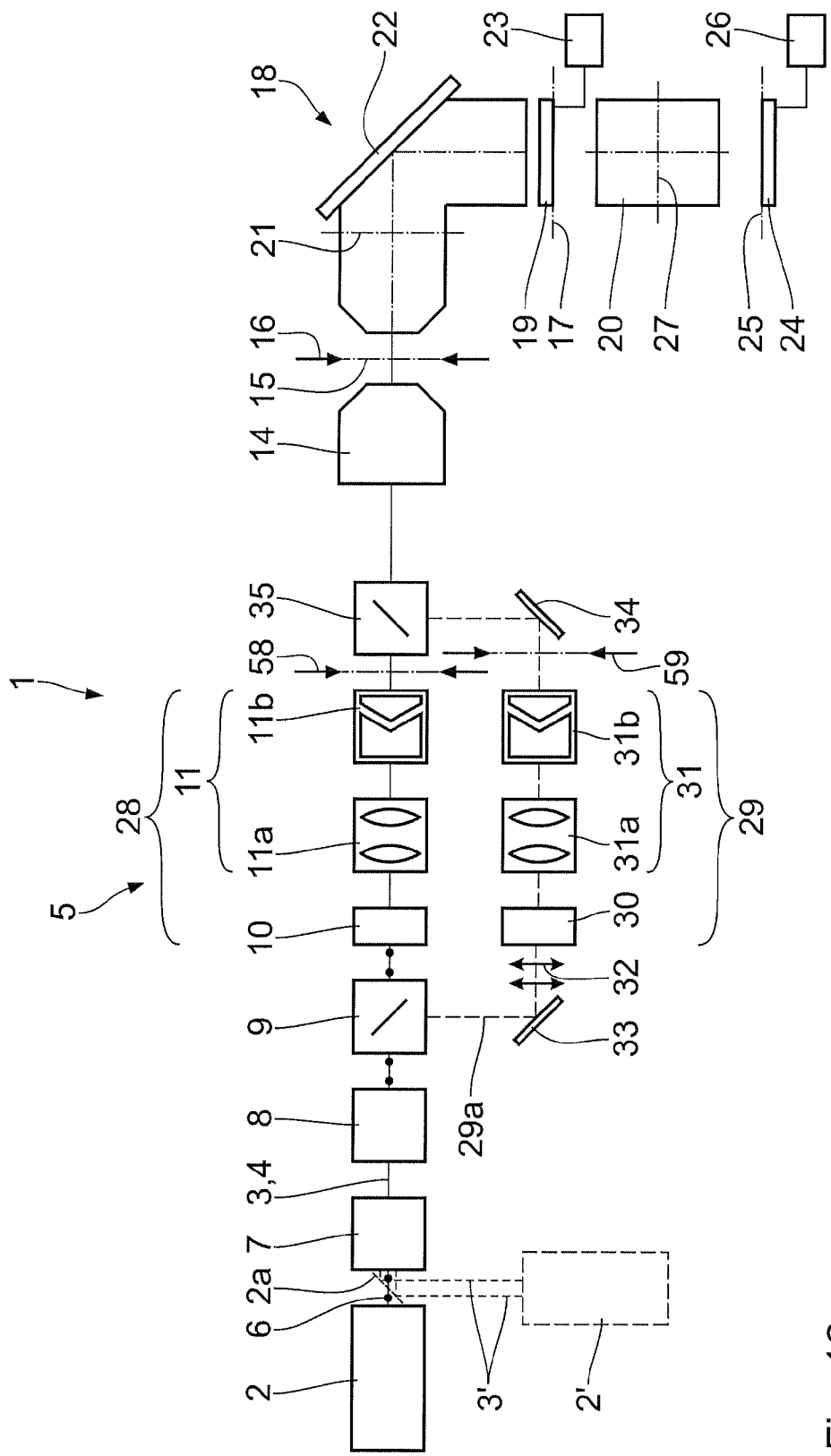
FIGS. 12 and 13 are schematic representations of embodiments of microlithographic projection exposure apparatuses.

FIG. 12 shows an embodiment of the projection exposure apparatus 1. Components that are identical to those already described above with reference to FIGS. 1 to 11 have the same reference numerals and are not individually described again.

In contrast to the projection exposure apparatus in FIGS. 1, 5, 10 and 11, the projection exposure apparatus 1 in FIG. 12 has pupil forming planes 58 and 59 which are each located in the optical paths to the optical modules 28, 29 and are therefore directly assigned to them. The pupil forming plane 58 is directly downstream from the axicon setup 11b of the first optical module 28. The pupil forming plane 59 is directly downstream from the axicon setup 31b of the second optical module 29 (located in the decoupling path 29a).

In the embodiment in FIG. 12, the pupil forming planes 58 and 59 replace the pupil forming plane 12 in FIG. 12. Alternatively, it is possible for the pupil forming planes 58 and 59 to be optically conjugate with the pupil forming plane 12.

Individual raster elements corresponding to raster element 13 in the projection exposure apparatus 1 in FIG. 1 can be assigned to the pupil forming planes 58 and 59.

In the case of the embodiment of the illumination system 5 in FIG. 12, pupil forming, i.e. setting an illumination setting, can be performed by using appropriate optical components in optical modules 28, 29, as is known in principle from the prior art, e.g. from WO 2005/027207 A.

Other components for influencing a pupil setting which can be used in optical modules 28, 29 are described in WO 2005/069081 A2, EP 1 681 710 A1, WO 2005/116772 A1, EP 1 582 894 A1 and WO 2005/027207 A1, which are hereby incorporated by reference.

Figure 13:
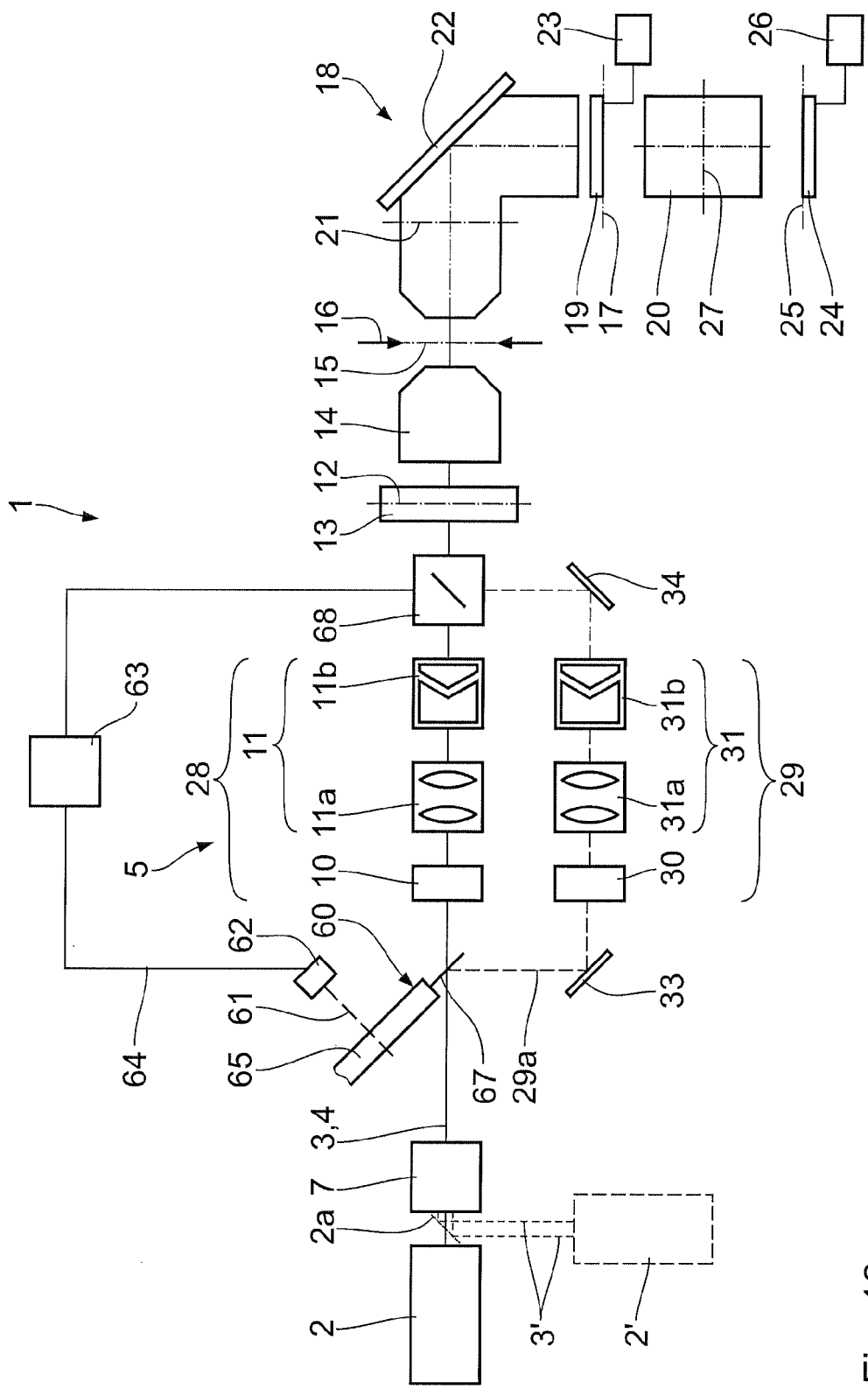

FIG. 13 shows an embodiment of the illumination system 5 of the projection exposure apparatus 1. Components that are identical to those already described above with reference to FIGS. 1 to 12 have the same reference numerals and are not individually described again.

Figure 14:
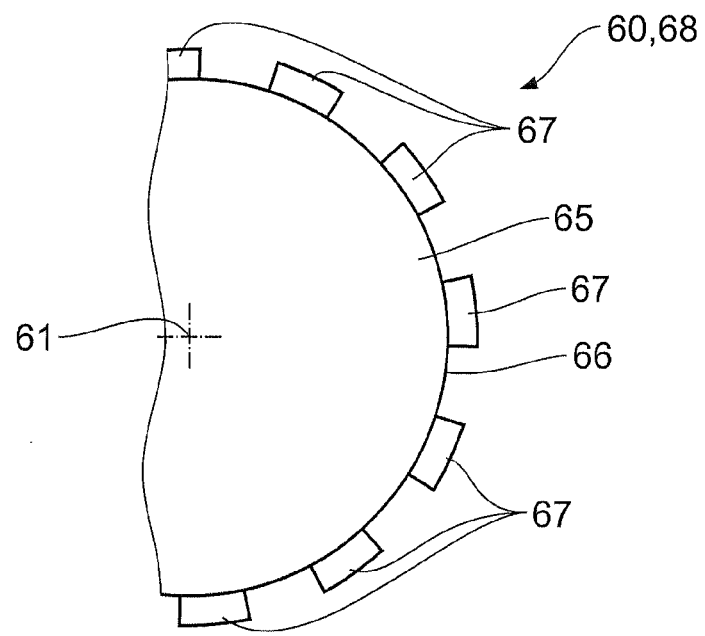
FIG. 14 is a schematic representation of an embodiment of a decoupling element and an embodiment of a coupling element.

In contrast to the illumination systems 5 in FIGS. 1 to 12, the mechanism for obtaining decoupling between optical modules 28, 29 in the case of the illumination system 5 in FIG. 13 is not based on influencing a light characteristic which is subsequently used to alter an optical path, but on directly influencing the path of the illumination light. To achieve this, the decoupling element 60 is provided in the form of a mirror element. The decoupling element 60 is located at the position of the decoupling beam splitter 9, e.g. in the embodiment in FIG. 1, and can rotate around axis 61 which lies in the projection plane of FIG. 13. This rotating movement is driven by a rotary drive 62. The rotary drive 62 is connected to synchronization module 63 by the signal cable 64. The decoupling element 60 has a disc-shaped mirror mount 65, part of which is shown in FIGS. 13 and 14. A multiplicity of individual mirrors 67 are fitted over the circumferential wall 66 of the mirror mount 65 and project beyond said wall.

The representation in FIG. 14 is not true scale. In fact, there can be a large number of individual mirrors 67, for example several hundred such individual mirrors, on the mirror mount 65.

In the circumferential direction, the gap between two adjacent individual mirrors 67 is equivalent to the circumferential extent of a single mirror 67. The individual mirrors 67 all have the same circumferential extent.

When the mirror mount 65 rotates, illumination light is either reflected by one of the mirrors 67 or passes between the individual mirrors 67 and is uneffected. Reflected illumination light impinges on the decoupling path 29a, i.e. the second optical module 29. Illumination light which is let through impinges on the first optical module 28.

In the case of the embodiment in FIG. 13, a coupling element 68 is located at the position of the coupling beam splitter 35 in the embodiment in FIG. 1 and the coupling element 68 has precisely the same structure as the decoupling element 60. The coupling element 68 is only shown schematically in FIG. 13. The coupling element 68, controlled by control module 63, is driven in synchronism with the decoupling element 60 so that whenever the decoupling element 60 lets illumination light through, the coupling element 68 also lets illumination light through unaffected. In contrast, when the decoupling element 60 reflects illumination light with one of the mirrors 67, this extracted illumination light, after passing through the decoupling path 29a, is reflected by a corresponding individual mirror of the coupling element 68 and is thereby injected into the adjacent common illumination light ray path towards reticle 19.

The speed of rotation of the coupling element 60 and that of the decoupling element 68 is synchronised with the pulse sequence from the light sources 2 and 2'.

Owing to the aspect ratio of the circumferential extent of the individual mirrors 67 relative to the circumferential extent of the gaps between adjacent the individual mirrors 67 of the decoupling element 60 and of the coupling element 68, it is possible to specify the proportion of illumination via the first optical module 28 on the one hand and via the second optical module 29 on the other hand. Such aspect ratios can be defined by the configuration and arrangement of the individual mirrors 67 on the circumferential wall 66 of the mirror mount 65 (e.g., from 1:10 to 10:1).

Figures 15, 16:
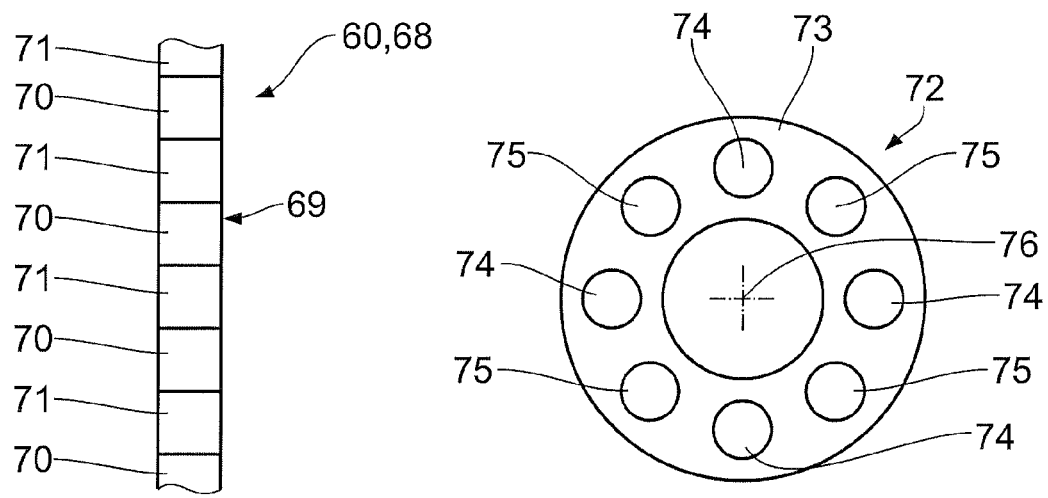
FIG. 15 is a schematic representation of an embodiment of a decoupling element and an embodiment of a coupling element.
FIG. 16 is a schematic representation of an embodiment of a polarization changer.

FIG. 15 shows an embodiment of the decoupling element 60 which can also be used in this form as the coupling element 68. The decoupling element 60 is in the form of strip-shaped mirror foil 69. The mirror foil 69 is divided up into individual mirrors 70 between which there are transparent gaps 71 through which illumination light can pass. The mirror foil 69 is an endless loop which is transported over corresponding guide rollers so that, at the location of the individual mirrors 67 in the embodiment in FIG. 13, it is transported perpendicularly to the plane of projection through the ray path of illumination light 3. In general, as long as illumination light is reflected by one of the individual mirrors 70, it is reflected by the decoupling element 60 into the decoupling path 29a and injected by the coupling element 68 back into the common ray path towards reticle 19. The illumination light is not affected by the transparent gaps 71 so that, in the case of the decoupling element 60, it passes through to the first optical module 28 and, in the case of the coupling element 68, it passes through to reticle 19.

The explanations given above regarding aspect ratios in connection with coupling and decoupling elements 60 and 68 in FIG. 14 also apply to the control of the mirror foil 69 driven via control module 63 and to the aspect ratio of the lengths of the individual mirrors 70 and the lengths of the gaps 71.

FIG. 16 shows a polarization changer 72 which can be used instead of the decoupling element 60. The polarization changer 72 is installed in the illumination system 5 in FIG. 1 at the location of the Pockels cell 8. The polarization changer 72 is rotatably driven around the rotation axis 76 which runs parallel to the light beam 3 between the light source 2 and the decoupling beam splitter 9. The polarization changer 72 is rotatably driven around the rotation axis 76 by an appropriate rotary drive synchronised via control module 63. The polarization changer 72 has a revolving support 73 with a total of eight revolving receptacles 74. A significantly larger number of receptacles 74 is possible. A λ/2 plate 75 is fitted in every second receptacle 74 in the circumferential direction. The other four receptacles 74 are empty. The optical axes of the four λ/2 plates 75 in total are therefore arranged so that, when one of the λ/2 plates 75 is in the ray path of the illumination light, the polarization of the illumination light is rotated through 90° as it passes through the λ/2 plate. The polarization changer 72 then has the same function as the Pockels cell 8 when high voltage is applied to it.

When one of the empty receptacles 74 lets the illumination light through unaffected, the polarization changer 72 functions as a deenergized Pockels cell.

A rotatable polarization-changing plate as described, for example in WO 2005/069081 A can be used as an alternative to the polarization changer 72.

A λ/2 plate placed in the ray path of illumination light beam 3, for example at the location of the Pockels cell 8 in the setup in FIG. 1 and which replaces the Pockels cell 8, can also be used as another alternative to the polarization changer 72. By rotating the λ/2 plate around a rotation axis parallel to illumination light beam 3 which passes through it, the polarization plane of the illumination light can be rotated through 90°, for example, so that the λ/2 plate has a polarization-changing effect equivalent to that of the Pockels cell 8 in the embodiment in FIG. 1. The optical axis of the λ/2 plate is in the plane of the plate as a rule. Other orientations of the optical axis of the λ/2 plate relative to the plane of the plate are also possible. Polarization-changing elements of the same kind as λ/2 plates are described, for example, in DE 199 21 795 A1, US 2006/0055834 A1 and WO 2006/040184 A2, which are hereby incorporated by reference.

Embodiments are described above assuming that the illumination system already includes two optical modules 28, 29. According to the disclosure, it is also possible to retrofit existing projection exposure apparatuses having an optical module equivalent to the first optical module 28 in the embodiments described above with a supplementary module, thereby producing one of the embodiments described above.

The retrofit supplementary module includes, besides the second optical module 29, the decoupling element 9 or 60 and the coupling element 35 or 68. Depending on the design of the supplementary module, it also has a light-characteristic changer, for example the Pockels cell 8 or the polarization changer 72. The main control system 43 may also be part of the supplementary module. The supplementary module may also include another light source 2' or 36 with appropriate coupling and decoupling optics (e.g., as described above in connection with FIGS. 1 and 5).

Embodiments have been described with reference to two differing illumination settings having differing spatial intensity distributions in the pupil or pupil plane 12. The term "illumination setting" refers not only to the spatial intensity distribution but also to the spatial polarization distribution in the pupil.

Using the at least two optical modules 28, 29, it is also possible to adjust a single spatial illumination setting with regard to the spatial intensity distribution in the pupil plane 12, the illumination settings differing merely in terms of their spatial polarization distribution in the pupil plane 12. Depending on the structures to be imaged, the second illumination setting can, for example, have a polarization distribution rotated through 90° in the pupil plane 12 relative to the polarization distribution of the first illumination setting in the pupil plane 12. It is thus possible, by suitable activation of the two optical modules 28, 29, to control the proportional illumination thereof using a control unit, such as for example the computer 43, so as to allow, for a single intensity illumination setting with which the reticle 19 is illuminated, various polarization states to be achieved during the illumination.

This can be advantageous, for example, if manufacturing processes are to be transferred from development installations in development centres to production installations in factories for manufacturing microstructured components or chip factories and these differing installations, in particular the projection objectives thereof for imaging mask structures onto the wafer, differ in terms of their polarization transfer characteristics. In such a case, it can be advantageous if, for a single intensity illumination setting, the development of which has been found to be optimal for a specific chip structure, use of the two optical modules allows the polarization characteristic to be controlled, so the production installations operated therewith also image optimum chip structures onto the wafer. Another application of the change in polarization characteristic at a single intensity illumination setting is obtained on illumination of chips in a scanning process in which, although a single intensity illumination setting was selected for illuminating the entire chip, the chip structures in differing regions of the chip can be imaged with higher contrast by differing polarization. In this case, it can be desirable to vary the polarization characteristics during the scanning process. In addition, the spatial intensity distribution of the illumination settings (e.g., intensity illumination setting), generated by the at least two optical modules, can also be altered during the scanning process.

A further aspect in the change in polarization characteristics at a single illumination setting can be obtained from what is known as polarization-induced birefringence. This is a material effect based on the fact that polarized irradiation of the material causes over time stress birefringence in the material through which the illumination light passes. Such material regions with illumination-induced stress birefringence form defect regions in the material. In order to prevent these material defects, circular or unpolarized light is, if possible, used. The present disclosure can allow the polarization characteristic to be altered at a single intensity illumination setting, thus allowing polarization-induced birefringence to be reduced, at least for the optical components following the coupling element.

Based on the foregoing embodiments, it is also possible using the at least two optical modules 28, 29 to generate any desired illumination settings having any desired polarization distributions in the pupil plane 12. It is in this case also possible to change rapidly between the illumination settings having the corresponding polarization states—up to a plurality of changes within a light pulse. Furthermore, it is possible to allow slow changes of the illumination settings in synchronism with the scanning process and at the same time to alter the polarization distribution within the at least two optical modules 28, 29 using appropriate polarization-influencing optical elements, such as for example a polarization rotation unit as described in WO 2006/040184 A2 or a rotatable λ/2 plate as disclosed, for example, in WO 2005/027207 A1, which are arranged in the modules 28, 29 or in the beam direction after these modules, for example in time correlation with the scanning process.

Polarization-influencing optical elements as presented, for example, in WO 2006/040184 A2 can allow relatively fast changes in the polarization characteristic within the two modules 28, 29. The disclosure therefore provides the flexibility to illuminate chip structures or combinations of differing chip structures of wafer partial regions, for example during the scanning process, with intensity illumination settings adapted to the requirements for imaging and/or spatial polarization distributions in the pupil plane of the projection exposure apparatus for imaging which is optimised with regard to contrast and resolution. For chip manufacturers, this can open up new possibilities for arranging differing chip structures on a wafer, as the disclosure allows combination of chip structures which, owing to the various requirements placed on the necessary illumination settings, may have been previously avoided on a single wafer or may have been imaged only with relatively high integration density.

With the foregoing embodiments, it is equally possible to provide, using the at least two optical modules 28, 29, a single intensity illumination setting even with the same spatial polarization distribution, i.e. two illumination settings which are similar within predetermined tolerances, in the pupil plane 12. This is, for example, advantageous if during the scanning process double exposure with two differing settings and/or differing polarization states would be inappropriate for specific partial regions of a chip, for the high-contrast imaging of chip structures into the partial region.

A further potential advantage of operating the two optical modules 28, 29 with identical illumination settings and identical spatial polarization distributions in the pupil plane 12 is that, on switching during the light pulse according to the switching-time example in FIG. 3, the peak load or, on switching between the light pulses according to the switching-time example in FIG. 2, the permanent load on the optical components in the two optical modules 28, 29 is reduced compared to operation of an identical illumination setting with the same polarization distribution in a conventional illumination system or compared to operation of the illumination setting in merely one of the two optical modules 28, 29.

FIGS. 18 to 29 specify examples of combinations of differing illumination settings in the pupil plane 12 with associated mask structures. The examples specified in FIGS. 18, 19, 22, 23, 26 and 27 are merely a small selection of the illumination settings achievable by the disclosure.

The terms "sigma inner (inner σ)", "sigma outer (outer σ)" and "polar width" will be used hereinafter for the purposes of characterization. The inner σ is in this case defined as the pupil radius in which 10% of the illumination light intensity is in the pupil. The outer σ is in this case defined as the pupil radius in which 90% of the illumination light intensity is in the pupil. The polar width is defined as the opening angle between radii which delimit a structure illuminated in the pupil plane and at which the intensity has fallen to 50% of the maximum intensity of this structure.

FIG. 18 shows an illumination setting in the form of dipole illumination in the X-direction having a polar width of 35°, an inner σ of 0.8 and an outer σ of 0.99. FIG. 19 shows a further illumination setting in the form of a dipole illumination in the Y-direction having a polar width of 35°, an inner σ of 0.3 and an outer σ of 0.5. The illumination setting in FIG. 18 can in this case be provided by the module 28 and the illumination setting in FIG. 19 by the module 29 or vice versa. If these illumination settings are to be operated in a polarized manner, it is advantageous if the illumination setting in FIG. 18 is polarized linearly in the Y direction. The polarization direction of the illumination setting in FIG. 19 is in this case not crucial for the imaging contrast as owing to the maximum outer σ of 0.5 the light beams strike the wafer while still at moderate angles in contrast to the illumination setting in FIG. 18.

FIGS. 20 and 21 show exemplary mask structures that can be illuminated and imaged with good imaging quality during a scanning process by double exposure or change-over of the illumination settings in FIGS. 18 and 19 provided by the optical modules 28, 29. The mask structure in FIG. 20 is in the form of thick vertical lines having an extension in the Y direction of 50 nm wide and a 50 nm spacing between the lines in the X direction. The mask structure in FIG. 21 is in the form of horizontal and vertical lines having a width greater than 100 nm. In the latter case, the lines are said to be isolated. The simultaneous imaging of structures in FIGS. 20 and 21 is a typical application in which on a mask in one direction relatively low width structures and at the same time in the same direction or perpendicularly thereto relatively non-low width structures are to be transferred via illumination onto the wafer. Depending on whether on a mask the aforementioned thick and isolated lines from FIGS. 20 and 21 are formed adjacently to or set apart from one another, the double exposure or the change-over or a mixture of double exposure and change-over of the illumination settings in FIGS. 18 and 19, correlated with the scanning process, will prove to be optimal for imaging the mask structures of FIGS. 20 and 21. The illumination setting in FIG. 18 is suitable for the high-contrast imaging of a mask having exclusively thick lines corresponding to the mask structure in FIG. 20 and the illumination setting in FIG. 19 is suitable for high-contrast imaging of a mask having exclusively isolated lines corresponding to the mask structure in FIG. 21.

FIG. 22 shows an illumination setting in the form a quasar or quadrupole illumination having poles with 35° polar width along the diagonal between the X and Y direction with an inner σ of 0.8 and an outer σ of 0.99. FIG. 23 shows an illumination setting in the form of a conventional illumination with an outer σ of 0.3. The illumination setting in FIG. 22 can in this case be provided by the module 28 and the illumination setting in FIG. 23 by the module 29 or vice versa. If these illumination settings are to be operated in a polarized manner, it is advantageous if the illumination setting in FIG. 22 is linearly polarized tangentially to the optical axis. The foregoing remarks concerning the polarization direction of the illumination setting in FIG. 19 accordingly apply to the polarization direction of the illumination setting in FIG. 23.

FIGS. 24 and 25 show mask structures which are to be provided by double exposure or change-over of the illumination settings in FIGS. 22 and 23 during a scanning process. These structures are relatively high packing density (FIG. 24) and relatively non-high packing density (FIG. 25) contact holes having a width of, for example, 65 nm. Depending on whether on a mask the aforementioned high packing density contact holes and non-high packing density contact holes from FIGS. 24 and 25 are formed adjacent to or set apart from one another, the double exposure or change-over or a mixture of double exposure and change-over of the illumination settings in FIGS. 22 and 23, correlated with the scanning process, will be found to be optimal for imaging the mask structures from FIGS. 24 and 25. The illumination setting in FIG. 22 is suitable for the high contrast imaging of a mask having exclusively relatively high packing density contact holes corresponding to the mask structure of FIG. 24 and the illumination setting in FIG. 23 can be best suited for the high-contrast imaging of a mask having exclusively non-high packing density contact holes corresponding to the mask structure of FIG. 25.

FIG. 26 shows an illumination setting in the form of an X-dipole illumination having poles with 35° polar width in the X direction with an inner σ of 0.8 and an outer σ of 0.99. FIG. 27 shows an illumination setting in the form of a Y-dipole illumination having poles with 35° polar width in the Y direction with an inner σ of 0.8 and an outer σ of 0.99. The illumination setting in FIG. 26 can in this case be provided by the module 28 and the illumination setting in FIG. 27 by the module 29 or vice versa. If these illumination settings are to be operated in a polarized manner, it is advantageous if the illumination setting in FIG. 26 is polarized linearly in the Y direction and the illumination setting in FIG. 27 is polarized linearly in the X direction.

FIGS. 28, 29 show the two masks which are successively to be imaged onto the same wafer to be illuminated by double exposure with the illumination settings in FIGS. 26 and 27 during two scanning processes. These masks are thick horizontal (FIG. 28) and vertical (FIG. 29) structures having a width of, for example, 50 nm and a line spacing of, for example, 50 nm. In contrast to the foregoing examples, for imaging the two masks in FIGS. 28, 29 there is carried out a double exposure in which there is carried out on the same wafer to be illuminated, in a first step, a scanning process with the mask in FIG. 28 and the illumination setting in FIG. 26 and, in a second step, a second scanning process with the mask in FIG. 29 and the illumination setting in FIG. 27. Two different illuminations are thus carried out on the same wafer with the differing masks. This double exposure with the differing masks therefore differs from the double exposure or change-over in a single mask in which merely the illumination setting with which the mask is illuminated is changed. It is also possible in this case for the two separate masks to be arranged next to each other in the reticle or mask plane and to be moved in the scanning direction by component 23 for holding and manipulating the masks or reticles. In this case, there is no need for a complex change of masks between the two illuminations and the masks can be successively transferred onto the same wafer to be illuminated in a single scanning process instead of in two scanning processes carried out in succession. Owing to the high scanning speed of the component 23, which is responsible for the high wafer throughput of the projection exposure apparatus, it is necessary to change the illumination settings for the two masks very rapidly during transfer of the masks in the one scanning process. In principle, it is not compulsory for the two separate masks to be arranged in the same plane. In principle, the two masks can also be arranged in various planes, the projection exposure apparatus being adapted during the change between the masks arranged in various planes by appropriate and optionally automatic adjustment of optical components.

In all of the above-mentioned illumination settings in FIGS. 18, 19, 22, 23, 26 and 27, the double or multiple exposure according to the disclosure of a mask with the two illumination settings in FIGS. 18 and 19, 22, 23, 26 and 27 with switching times of up to 1 ns or the change-over according to the disclosure of the two settings allows precise monitoring and optimization of the light intensity within the two settings. This can allow for the scanning process with a mask structure in FIGS. 20, 21, 24, 25, 28 and 29 good (e.g., optimum) structures and structure widths to be achieved on the wafer to be illuminated. It is in this case also possible for the two zoom-axicon groups 11, 31 of the two optical modules 28, 29 to be controlled over a slower time scale during the scanning process in order to alter the inner and outer minimum or maximum illumination angles, defined by the two respectively utilized illumination settings.

Figure 17:
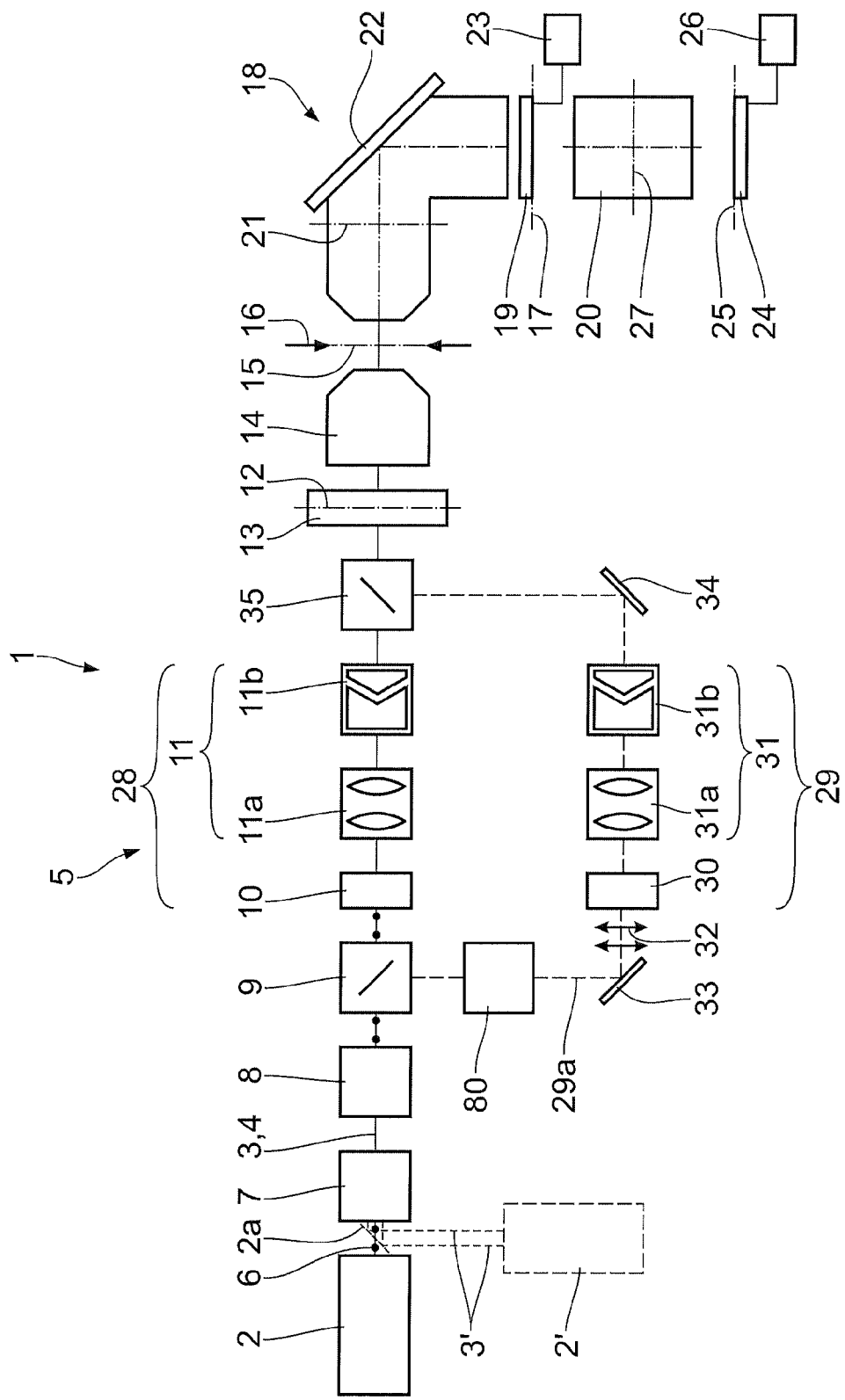
FIG. 17 is a schematic representation of an embodiment of a microlithographic projection exposure apparatus.

A further potential advantage of operating the at least two optical modules 28, 29 with identical or differing illumination settings and with identical or differing polarization distributions in the pupil plane 12 is obtained on switching during the light pulse in accordance with the switching-time example in FIG. 3 if, within an optical module 28 or 29, use is made of an optical component 80 which delays the partial light pulse of the module (see FIG. 17). The optical component 80 may, for example, consist of a correspondingly folded optical delay line, of at least two mirrors or of corresponding equivalents which allow the light propagation time to be extended. Switching during the light pulse in accordance with the switching-time example in FIG. 3 allows, as stated hereinbefore, a laser having an output with a repetition rate of 12 kHz to be produced from a laser having a repetition rate of, for example, 6 kHz. The optical component 80 in FIG. 17 then delays the partial light pulse of the illumination light in the optical module 29 in relation to the other partial light pulse of the illumination light in the other optical module 28 with regard to the light propagation time in such a way that, for example, the partial light pulses from the one module 28 are mutually time-shifted with respect to the partial light pulses from the other module in such a way that chronologically equidistant light pulses arrive on the reticle 19 to be illuminated. In this case, the light pulses $L_1$, $L_2$ are time-delayed by the interval of adjacent laser pulses L at the location at which they were separated at the switching instant $t_s$, so all the laser pulse parts $L_1$, $L_2$ generated by the switching are at the same intervals from one another after the coupling element. Thus, for example, not only can a 6 kHz laser be split up to form a 12 kHz laser, the dose per time interval of the split 12 kHz laser can, for example, also be controlled so as substantially to correspond to the dose per time interval of a real 12 kHz laser. This is important for a scanning process with pulsed light sources, as it has to be ensured that each partial region of a chip is given the same dose of light during the scanning process. If, as mentioned hereinbefore, the two modules 28, 29 are operated proportionally, i.e. with, in their dose, differing partial light pulses in the period of time and/or with varying intensity, a chronologically non-equidistant pulse sequence of the light pulses arriving on the reticle 19 from the two modules 28, 29 may be beneficial with regard to the dose.

It should be noted that the above-mentioned polarization setting within the two optical modules 28, 29 or thereafter is not only beneficial with regard to the adjustment of the spatial polarization distribution in the pupil plane 12 for the respective illumination settings, as for example in FIG. 18, 19, 22, 23, 26 or 27; it is also beneficial to preserve a certain polarization state which is varied by the two optical modules 28, 29 themselves, the subsequent lens system, the reticle 19, the projection objective 20 and/or by a photoresist layer of the wafer 24 to be illuminated. It is thus possible to provide on the wafer 24 the polarization state respectively required for high-contrast imaging even if the polarization state changes in the light path from the polarization-influencing optical elements to the wafer 24. This preservation of a spatial polarization distribution may also prove beneficial only during operation of a projection exposure apparatus if, owing to slow changes in the optical characteristics of the optical elements of the illumination system 5, the projection objective 20 and the reticle 19, these optical elements alter the polarization state of the light passing therethrough. Slow changes of this type may, for example, be brought about by thermal drifts.

As an alternative to switching the polarization using a Pockels cell 8; 39 or a Kerr cell, use may also be made of a magneto-optic switch based on the Faraday effect.

As an alternative to the aforementioned switching or decoupling using the light wavelength as the exchangeable light characteristic, Raman cells, as described in U.S. Pat. No. 4,458,994, or Bragg cells, as described in U.S. Pat. No. 5,453,814, may be used. U.S. Pat. No. 4,458,994 and U.S. Pat. No. 5,453,814 are hereby incorporated by reference. Use may be made for this purpose of a photoelastic modulator (PEM) such as is described, for example, in US 2004/0262500 A1, which is hereby incorporated by reference.

As an alternative to the aforementioned possible switching or decoupling elements, use may also be made of combinations of the aforementioned options, especially combinations in which at least one component operates of the basis of an electro-optical or magneto-optical principle.

Other embodiments are in the claims.

What is claimed is:

1. A system, comprising: a microlithographic projection exposure apparatus having a pupil plane and being configured to image an object into an image plane using multiple, nearly periodic pulses of light, the microlithographic projection exposure apparatus comprising:
a device configured to change an illumination setting in the pupil plane from a first illumination setting to a second illumination setting within one second or less,
wherein:
the first illumination setting is different from the second illumination setting;
the microlithographic projection exposure apparatus comprises a first optical element and a second optical element;
in a first mode of the device, the device is configured to direct a pulse of the light so that the pulse of the light passes through the first optical element without passing through the second optical element; and
in a second mode of the device, the device is configured to direct a pulse of the light so that the pulse of the light passes through the second optical element without passing through the first optical element.

2. The system of claim 1, wherein the device is configured to control a ratio of a number of pulses of the light provided to the first optical element to a number of pulses of the light provided to the second optical element.

3. The system of claim 1, wherein the device is configured to determine a frequency at which of pulses of the light provided to the first optical element and a frequency of at which pulses of the light provided to the second optical element.

4. A system, comprising:
a microlithographic projection exposure apparatus having a pupil plane and being configured to image an object into an image plane using multiple, nearly periodic pulses of light, the microlithographic projection exposure apparatus comprising:
a device configured to change an illumination setting in the pupil plane from a first illumination setting to a second illumination setting within one second or less,
wherein:
the first illumination setting is different from the second illumination setting;
the microlithographic exposure apparatus comprises a first optical element and a second optical element; and
the device is configured to determine a duration during which pulses of the light are provided to the first optical element and a duration of time during which pulses of the light are provided to the second optical element.

5. The system of claim 4, wherein:
the device comprises at least one decoupling element in an optical path upstream of the first and second optical elements;
the device is configured to provide light pulses to the first and second optical elements; and
the device is configured to control the decoupling element to determine a ratio of the average pulse duration provided to the first optical element to the average pulse duration provided to the second optical element.

6. The system of claim 4, wherein the first illumination setting is a first dipole illumination setting, and the second illumination setting is a second dipole illumination setting.

7. The system of claim 6, wherein the first dipole illumination setting has a first dipole direction, the second dipole illumination setting has a second dipole direction, and the first dipole direction is different from the second dipole direction.

8. The system of claim 4, wherein the first illumination setting is a quadrupole illumination setting, and the second illumination setting is a single central pole illumination setting.

9. The system of claim 4, wherein the device is configured to change the illumination setting in synchronism with a scanning process.

10. A system, comprising:
a microlithographic projection exposure apparatus having a pupil plane and being configured to image an object into an image plane using multiple, nearly periodic pulses of light, the microlithographic projection exposure apparatus comprising:
a device configured to change an illumination setting in the pupil plane from a first illumination setting to a second illumination setting within one second or less,
wherein:
the first illumination setting is different from the second illumination setting; and
the device is configured to change an illumination setting in the pupil plane between more than two illumination settings.

11. The system of claim 10, wherein:
the microlithographic projection exposure apparatus comprises a first optical element, a second optical element, and a third optical element; and
the device is configured to determine a number of pulses provided to each of the first, second and third optical elements.

12. The system of claim 11, wherein the device comprises a first light characteristic changer and a second light characteristics changer.

13. A method, comprising:
   using an illumination system to illuminate a mask with pulses of light;
   while using the illumination system, changing an illumination setting in a pupil plane of the illumination setting from a first illumination setting to a second illumination setting within one second or less; and
   using a projection objective to project the light from the mask to a to a light-sensitive material,
   comprising, while using the illumination system, changing an illumination setting in the pupil plane between more than two illumination settings.

14. A method, comprising:
   using an illumination system to illuminate a mask with pulses of light;
   while using the illumination system, changing an illumination setting in a pupil plane of the illumination setting from a first illumination setting to a second illumination setting within one second or less; and
   using a projection objective to project the light from the mask to a to a light-sensitive material,
   comprising, while using the illumination system, changing the illumination setting in the pupil plane of the illumination setting from the first illumination setting to the second illumination setting within one microsecond.

15. A system, comprising:
   a microlithographic projection exposure apparatus having a pupil plane and being configured to image an object into an image plane using multiple, nearly periodic pulses of light, the microlithographic projection exposure apparatus comprising:
   a device configured to change an illumination setting in the pupil plane from a first illumination setting to a second illumination setting without moving any parts of the device,
   wherein the first illumination setting is different from the second illumination setting, and
   wherein the microlithographic projection exposure apparatus comprises:
      a first optical element;
      a second optical element; and
      a device configured so that:
         in a first mode of the device, the device is configured to direct a pulse of the light so that the pulse of the light passes through the first optical element without passing through the second optical element;
         in the first mode of the device, the pupil plane has the first illumination setting;
         in a second mode of the device, the device is configured to direct a pulse of the light so that the pulse of the light passes through the second optical without passing through the first optical element; and
         in the second mode of the device, the pupil plane has the second illumination setting.

16. A system, comprising:
   a microlithographic projection exposure apparatus having a pupil plane and being configured to image an object into an image plane using multiple, nearly periodic pulses of light, the microlithographic projection exposure apparatus comprising:
   a first optical element;
   a second optical element; and
   a device configured so that:
      in a first mode of the device, the device is configured to direct a pulse of the light so that the pulse of the light passes through the first optical element without passing through the second optical element;
      in the first mode of the device, the pupil plane has a first illumination setting;
      in a second mode of the device, the device is configured to direct a pulse of the light so that the pulse of the light passes through the second optical without passing through the first optical element; and
      the second mode of the device, the pupil plane has a second illumination setting which is different from the first illumination setting.

* * * * *

UNITED STATES PATENT AND TRADEMARK OFFICE
CERTIFICATE OF CORRECTION

PATENT NO. : 9,223,226 B2  
APPLICATION NO. : 13/325734  
DATED : December 29, 2015  
INVENTOR(S) : Alexander Kohl Page 1 of 1

It is certified that error appears in the above-identified patent and that said Letters Patent is hereby corrected as shown below:

In The Specification

Col. 7, line 10, delete "apparatus" and insert -- apparatus. --.

Col. 16, line 46, delete "$t_S$" and insert -- $t_s$ --.

Col. 17, line 24, delete "a least" and insert -- at least --.

Col. 25, line 30, delete "of the" and insert -- on the --.

In The Claims

Col. 27, line 9, Claim 13, delete "to a to a" and insert -- to a --.

Col. 27, line 21, Claim 14, delete "to a to a" and insert -- to a --.

Signed and Sealed this  
Third Day of May, 2016

Michelle K. Lee  
*Director of the United States Patent and Trademark Office*